United States Patent
Muraoka et al.

(10) Patent No.: US 9,153,319 B2
(45) Date of Patent: Oct. 6, 2015

(54) METHOD FOR DRIVING NONVOLATILE MEMORY ELEMENT, AND NONVOLATILE MEMORY DEVICE HAVING A VARIABLE RESISTANCE ELEMENT

(75) Inventors: Shunsaku Muraoka, Osaka (JP); Satoru Mitani, Osaka (JP); Takeshi Takagi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 162 days.

(21) Appl. No.: 14/004,447

(22) PCT Filed: Mar. 13, 2012

(86) PCT No.: PCT/JP2012/001729
§ 371 (c)(1),
(2), (4) Date: Sep. 11, 2013

(87) PCT Pub. No.: WO2012/124314
PCT Pub. Date: Sep. 20, 2012

(65) Prior Publication Data
US 2014/0029330 A1 Jan. 30, 2014

(30) Foreign Application Priority Data

Mar. 14, 2011 (JP) .................................. 2011-055107
Mar. 14, 2011 (JP) .................................. 2011-055108

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/0007* (2013.01); *H01L 27/101* (2013.01);
(Continued)

(58) Field of Classification Search
CPC ........... G11C 13/0069; G11C 13/0004; G11C 13/0007
USPC .............................. 365/148, 189.15, 218, 226
See application file for complete search history.

(56) References Cited

U.S. PATENT DOCUMENTS 7,369,431 B2 5/2008 Muraoka et al.
7,511,985 B2 3/2009 Horii et al.
(Continued)

FOREIGN PATENT DOCUMENTS

JP 2004-363604 12/2004
JP 2007-515026 6/2007
(Continued)

OTHER PUBLICATIONS

International Search Report issued Jun. 26, 2012 in International (PCT) Application No. PCT/JP2012/001729.
(Continued)

*Primary Examiner* — Connie Yoha
(74) *Attorney, Agent, or Firm* — Wenderoth, Lind & Ponack, L.L.P.

(57) ABSTRACT

A method for driving a nonvolatile memory element includes: a writing step of changing a variable resistance layer to a low resistance state, by applying a writing voltage pulse having a first polarity; and an erasing step of changing the variable resistance layer to a high resistance state, by applying an erasing voltage pulse having a second polarity different from the first polarity, wherein in the writing step, a first input and output terminal of a field effect transistor is a source terminal of the transistor, and when a pulse width of the writing voltage pulse is PWLR and a pulse width of the erasing voltage pulse is PWHR, PWLR and PWHR satisfy a relationship of PWLR<PWHR.

21 Claims, 22 Drawing Sheets

(51) Int. Cl.
 *H01L 27/10* (2006.01)
 *H01L 27/24* (2006.01)
 *H01L 45/00* (2006.01)

(52) U.S. Cl.
 CPC ............ *H01L27/2436* (2013.01); *H01L 45/04* (2013.01); *H01L 45/08* (2013.01); *H01L 45/1233* (2013.01); *H01L 45/146* (2013.01); *G11C 2013/0073* (2013.01); *G11C 2013/0092* (2013.01); *G11C 2213/32* (2013.01); *G11C 2213/79* (2013.01)

(56) References Cited

U.S. PATENT DOCUMENTS

| | | | |
|---|---|---|---|
| 7,826,247 | B2 | 11/2010 | Muraoka et al. |
| 7,884,699 | B2 | 2/2011 | Hosoi |
| 8,022,502 | B2 | 9/2011 | Kanzawa et al. |
| 8,101,983 | B2 | 1/2012 | Seo et al. |
| 8,125,818 | B2 | 2/2012 | Muraoka et al. |
| 8,164,130 | B2 | 4/2012 | Seo et al. |
| 8,445,319 | B2 | 5/2013 | Kanzawa et al. |
| 2004/0245557 | A1 | 12/2004 | Seo et al. |
| 2007/0114587 | A1 | 5/2007 | Seo et al. |
| 2007/0115714 | A1 | 5/2007 | Muraoka et al. |
| 2007/0285972 | A1 | 12/2007 | Horii et al. |
| 2008/0259678 | A1 | 10/2008 | Muraoka et al. |
| 2009/0262568 | A1 | 10/2009 | Ono et al. |
| 2009/0283736 | A1 | 11/2009 | Kanzawa et al. |
| 2010/0085142 | A1 | 4/2010 | Hosoi |
| 2010/0271860 | A1* | 10/2010 | Muraoka et al. ............... 365/148 |
| 2011/0002158 | A1 | 1/2011 | Muraoka et al. |
| 2011/0044088 | A1 | 2/2011 | Muraoka et al. |
| 2011/0044092 | A1 | 2/2011 | Ono et al. |
| 2011/0080770 | A1* | 4/2011 | Muraoka et al. ............... 365/148 |
| 2011/0294259 | A1 | 12/2011 | Kanzawa et al. |
| 2011/0299322 | A1* | 12/2011 | Iijima et al. .................... 365/148 |
| 2011/0305070 | A1* | 12/2011 | Ishihara ......................... 365/148 |
| 2011/0310652 | A1 | 12/2011 | Kim et al. |
| 2014/0321197 | A1* | 10/2014 | Ninomiya et al. ............. 365/148 |

FOREIGN PATENT DOCUMENTS

| | | |
|---|---|---|
| JP | 2007-310956 | 11/2007 |
| JP | 2009-026382 | 2/2009 |
| JP | 2009-104715 | 5/2009 |
| JP | 2012-009124 | 1/2012 |
| WO | 2005/059921 | 6/2005 |
| WO | 2007/018026 | 2/2007 |
| WO | 2008/149484 | 12/2008 |
| WO | 2009/107370 | 9/2009 |
| WO | 2009/145308 | 12/2009 |
| WO | 2010/021134 | 2/2010 |

OTHER PUBLICATIONS

W. W. Zhuang et al., "Novell Colossal Magnetoresistive Thin Film Nonvolatile Resistance Random Access Memory (RRAM)", 2002 IEEE International Electron Devices Meeting (IEDM), Dec. 8-11, 2002, p. 193-196.

\* cited by examiner

METHOD FOR DRIVING NONVOLATILE MEMORY ELEMENT, AND NONVOLATILE MEMORY DEVICE HAVING A VARIABLE RESISTANCE ELEMENT

TECHNICAL FIELD

The present invention relates to a method for driving a nonvolatile memory element and a nonvolatile memory device which performs the driving method.

BACKGROUND ART

In recent years, with advance in digital technology, electronic devices such as mobile information devices and information consumer electronics have been developed to provide higher functionality. With the higher functionality of such electronic devices, there is a rapid progress in miniaturization and speeding up of semiconductor elements for use in the electronic devices. Among them, the usage of high-capacity nonvolatile memory device such as flash memory is rapidly expanding. Furthermore, as a next-generation nonvolatile memory device to replace the flash memory, research and development is under way for a nonvolatile memory device including a variable resistance nonvolatile memory element has a feature that a resistance value reversibly changes according to electrical signals.

FIG. 22 is a cross-sectional view showing a configuration of a conventional example of such nonvolatile memory element (for example, refer to Patent Literature 1 and Non Patent Literature 1). As shown in FIG. 22, in a nonvolatile memory device 1030, a transistor 1020 and a nonvolatile memory unit 101 are formed on a main surface of a semiconductor substrate 1024. The transistor 1020 is a circuit for controlling conduction to a bit line of the nonvolatile memory unit 1010, and comprises a source region 1025b, a drain region 1025a, a gate insulating film 1026, and a gate electrode 1027. The nonvolatile memory unit 1010 includes a bottom electrode 1002 connected to the drain region 1005a, a variable resistance layer 1003 in which a resistance reversibly changes according to a voltage pulse or a current pulse, and a top electrode 1004. Furthermore, the transistor 1020 and the nonvolatile memory unit 1010 formed above the semiconductor substrate 1024 are covered with an interlayer dielectric 1028, and the top electrode 1004 is connected to an electrode wiring 1029.

In Patent Literature 1, as a substance composed in the variable resistance layer 1003, one of nickel oxide (NiO), vanadium oxide ($V_2O_5$), zinc oxide (ZnO), niobium oxide ($Nb_2O_5$), titanium oxide ($TiO_2$), tungsten oxide ($WO_3$), cobalt oxide (CoO), and the like is used. It is known that such transition metal oxide shows a specific resistance value when a voltage or a current having greater than or equal to a threshold value is applied, and that the resistance value is maintained until a voltage or a current is newly applied. Moreover, in Non Patent Literature 1, as the substance composed in the variable resistance layer 1003, $Pr_{(1-x)}Ca_xMnO_3$ (PCMO) is used. A perovskite material is known to show the above described variable resistance property.

CITATION LIST

Patent Literature

Japanese Unexamined Patent Application Publication No. 2004-363604

Non Patent Literature

W. W. Zhuang et al., "Novell Colossal Magnetoresistive Thin Film Nonvolatile Resistance Random Access Memory (RRAM)", IEDM Technical Digest, pp. 193-196, December 2002

SUMMARY

A variable resistance nonvolatile memory element has a problem of endurance characteristics (resistance to repeated write). In other words, since a change in the resistance value of the variable resistance layer is not reliable when write is repeated a predetermined number of times, there is a problem that a write error easily occurs.

The present invention is conceived in light of the problem, and has an object to provide a method for driving a nonvolatile memory element capable of increasing endurance characteristics and a nonvolatile memory device performing the method.

In order to solve the above described problem, a method for driving a nonvolatile memory element according to an aspect of the present invention is a method for driving a nonvolatile memory element which includes: (i) a variable resistance element which includes a first terminal, a second terminal, and a variable resistance layer which is provided between the first terminal and the second terminal and has a resistance value that reversibly changes according to a voltage pulse applied to between the first terminal and the second terminal; and (ii) a field-effect transistor which includes a first input and output terminal connected to the second terminal, a second input and output terminal, and a gate terminal which controls conduction between the first input and output terminal and the second input and output terminal, and the method comprises: a writing step of changing the variable resistance layer from a high resistance state to a low resistance state, by applying a writing voltage pulse having a first polarity to between the first terminal and the second input and output terminal; and an erasing step of changing the variable resistance layer from a low resistance state to a high resistance state, by applying an erasing voltage pulse having a second polarity different from the first polarity to between the first terminal and the second input and output terminal, wherein in the writing step, the first input and output terminal is a source terminal, and when a pulse width of the writing voltage pulse is PWLR and a pulse width of the erasing voltage pulse is PWHR, PWLR and PWHR satisfy a relationship of PWLR<PWHR.

With the method for driving a nonvolatile memory element according to the present invention, it is possible to realize a reliable memory operation. Moreover, with the nonvolatile memory device, according to the present invention, which performs the driving method, it is possible to realize a memory deice having excellent endurance characteristics.

DETAILED DESCRIPTION

Figure 1:
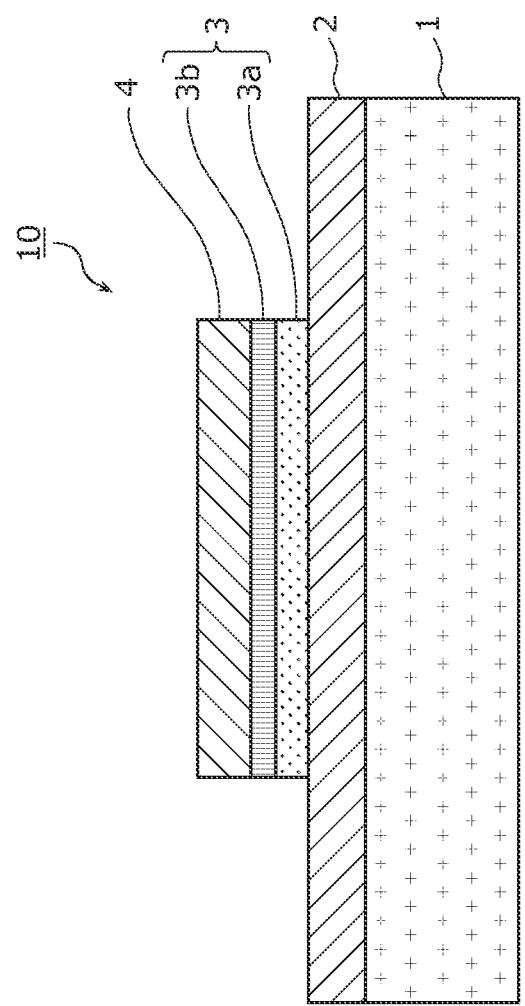
FIG. 1 is a cross-sectional view of a variable resistance element included in a nonvolatile memory element according to Embodiment 1 of the present invention.

A method for driving a nonvolatile memory element which includes: (i) a variable resistance element which includes a first terminal, a second terminal, and a variable resistance layer which is provided between the first terminal and the second terminal and has a resistance value that reversibly changes according to a voltage pulse applied to between the first terminal and the second terminal; and (ii) a field-effect transistor which includes a first input and output terminal connected to the second terminal, a second input and output terminal, and a gate terminal which controls conduction between the first input and output terminal and the second input and output terminal, the method comprising: a writing step of changing the variable resistance layer from a high resistance state to a low resistance state, by applying a writing voltage pulse having a first polarity to between the first terminal and the second input and output terminal; and an erasing step of changing the variable resistance layer from a low resistance state to a high resistance state, by applying an erasing voltage pulse having a second polarity different from the first polarity to between the first terminal and the second input and output terminal, wherein in the writing step, the first input and output terminal is a source terminal, and when a pulse width of the writing voltage pulse is PWLR and a pulse width of the erasing voltage pulse is PWHR, PWLR and PWHR satisfy a relationship of PWLR<PWHR.

With this aspect, a high resistance state of the variable resistance layer at the time of erasing can be a high resistance state in which leakage current is small and which has a precision. Therefore, even when write current value is limited by the body effect at the time of write, an effective voltage for changing to the low resistance state can be sufficiently applied to the variable resistance layer. As a result, it is possible to realize excellent endurance characteristics. In other words, it is possible to keep the resistance value in a low variable resistance state at a constant value with the body effect, and to apply a sufficient effective voltage for resistance change.

When a voltage value of the writing voltage pulse is VLR and a voltage value of the erasing voltage pulse is VHR, absolute values of VLR and VHR may satisfy a relationship of |VLR|=|VHR|.

With this aspect, better endurance characteristics can be obtained.

When a voltage value of the writing voltage pulse is VLR and a voltage value of the erasing voltage pulse is VHR, absolute values of VLR and VHR may satisfy a relationship of |VLR|>|VHR|.

With this aspect, even when the body effect is generated in the field-effect transistor, a current value when changing the variable resistance layer from a high resistance state to a low resistance state can be greater. As a result, good endurance characteristics can be realized. In other words, it is possible to keep the resistance value under a low variable resistance state at a constant value by the body effect, and to enlarge a current value limited by the body effect to a level which is enough to lower resistance.

Moreover, the variable resistance layer comprises a tantalum oxide, and the absolute values of VLR and VHR may further satisfy a relationship of |VLR|>|VHR|+0.3 V.

With this configuration, better endurance characteristics can be obtained.

Moreover, the field-effect transistor is an N-type MISFET, and the first polarity may be a polarity in which a potential of the second input and output terminal is higher than a potential of the first terminal.

Generally, the electron mobility is larger than the hole mobility. Therefore, when MISFETs are formed in the same size and in the same structure of the gate insulating film (material and thickness), an N-type MISFET is greater than a P-type MISFET in current drivability. Therefore, with this aspect, when the same size of MISFET having the same current drivability is manufactured, the N-type MISFET can be smaller than the P-type MISFET in element size.

Moreover, the field-effect transistor is a P-type MISFET, and the first polarity may be a polarity in which a potential of the second input and output terminal is lower than a potential of the first terminal.

Moreover, the variable resistance layer comprises a tantalum oxide.

With this aspect, reliable resistance change can be realized.

Moreover, the variable resistance layer may include: a first region which includes an oxygen-deficient tantalum oxide having a composition represented by $TaO_x$; and a second region which includes a second tantalum oxide having a composition represented by $TaO_y (x<y)$.

With this aspect, since the voltage applied to the variable resistance layer is distributed more to the second region with a relatively high resistance value, it is possible for the resistance change phenomenon to stably occur in the second region.

Moreover, a nonvolatile memory device according to an aspect of the present invention comprises: a nonvolatile memory element which includes: (i) a variable resistance element which includes a first terminal, a second terminal, a variable resistance layer which is provided between the first terminal and the second terminal and has a resistance value that reversibly changes according to a voltage pulse applied to between the first terminal and the second terminal; and (ii) a field-effect transistor which includes a first input and output terminal connected to the second terminal, a second input and output terminal, and a gate terminal which controls conduction between the first input and output terminal and the second input and output terminal; and a voltage application unit which performs: a writing step of changing the variable resistance layer from a high resistance state to a low resistance state, by applying a writing voltage pulse having a first polarity to between the first terminal and the second input and output terminal; and an erasing step of changing the variable resistance layer from a low resistance state to a high resistance state, by applying an erasing voltage pulse having a second polarity different from the first polarity to between the first terminal and the second input and output terminal, wherein in the writing step, the first input and output terminal is a source terminal, and when a pulse width of the writing voltage pulse is PWLR and a pulse width of the erasing voltage pulse is PWHR, the voltage application unit is configured to apply the writing voltage and the erasing voltage to the nonvolatile memory element, to allow PWLR and PWHR to satisfy a relationship of PWLR<PWHR.

With this aspect, a high resistance state of the variable resistance layer at the time of erasing can be a high resistance state in which leakage current is small and which has an extreme precision. Therefore, even when write current value is limited by the body effect at the time of write, an effective voltage for changing to the low resistance state can be sufficiently applied to the variable resistance layer. As a result, good endurance characteristics can be realized. In other words, it is possible to keep the resistance value under a low variable resistance state at a constant value by the body effect, and to apply a sufficient effective voltage for resistance change.

Moreover, when a voltage value of the writing voltage pulse is VLR and a voltage value of the erasing voltage pulse is VHR, the voltage application unit may be configured to apply the writing voltage and the erasing voltage to the nonvolatile memory element, to allow absolute values of VLR and VHR to satisfy a relationship of |VLR|=|VHR|.

With this configuration, better endurance characteristics can be obtained.

Moreover, when a voltage value of the writing voltage pulse is VLR and a voltage value of the erasing voltage pulse is VHR, the voltage application unit may be configured to apply the writing voltage and the erasing voltage to the nonvolatile memory element, to allow absolute values of VLR and VHR to satisfy a relationship of |VLR|>|VHR|.

With this aspect, even when the body effect is generated in the field-effect transistor, a current value can be greater when changing the variable resistance layer from a high resistance state to a low resistance state. As a result, good endurance characteristics can be realized. In other words, it is possible to keep the resistance value in a low variable resistance state at a constant value by the body effect, and to enlarge a current value limited by the body effect to a level which is enough to lower resistance.

Moreover, the variable resistance layer comprises a tantalum oxide, and the voltage application unit may be configured to apply the writing voltage and the erasing voltage to the nonvolatile memory element, to allow the absolute values of VLR and VHR to satisfy a relationship of |VLR|>|VHR|+0.3 V.

With this configuration, better endurance characteristics can be obtained.

Moreover, the field-effect transistor is an N-type MISFET, and the voltage application unit may be configured to apply, in the writing step, a voltage having a polarity in which a potential of the second input and output terminal is higher than a potential of the first terminal.

Generally, the electron mobility is larger than the hole mobility. Therefore, when MISFETs are formed in the same size and in the same structure of the gate insulating film (material and film thickness), an N-type MISFET is greater than a P-type MISFET in current drivability. Therefore, with this aspect, when the same size of MISFET having the same current drivability is manufactured, the N-type MISFET can be smaller than the P-type MISFET in element size.

Moreover, the field-effect transistor is a P-type MISFET, and the voltage application unit is configured to apply, in the erasing step, a voltage having a polarity in which a potential of the second input and output terminal is lower than a potential of the first terminal.

Moreover, the variable resistance layer may comprise a transition metal oxide.

With this aspect, reliable resistance change can be realized.

Moreover, the transition metal oxide may be selected from the group consisting of a tantalum oxide, a zirconium oxide, and a hafnium oxide.

Moreover, the transition metal oxide may include: a first region which includes an oxygen-deficient transition metal oxide having a composition represented by $MO_x$; and a second region which includes a transition metal oxide having a composition represented by $MO_y$ (x<y).

With this aspect, since the voltage applied to the variable resistance layer is distributed more to the second region with a relatively high resistance value, it is possible for the resistance change phenomenon to stably occur in the second region.

Moreover, in the first and second regions, a transition metal element M of the transition metal oxide may be selected from the group consisting of tantalum, zirconium, and hafnium.

Moreover, the transition metal oxide may include a first region which includes an oxygen-deficient transition metal oxide having a composition represented by $MO_x$ when a first transition metal is represented by M, and a second region which includes a transition metal oxide having a composition represented by $NO_y$ when a second transition metal oxide different from the first transition metal oxide is represented by N, and the $NO_y$ may be lower than the $MO_x$ in degree of oxygen deficiency.

Moreover, the second transition metal Nis lower than the first transition metal M in standard electrode potential.

With this aspect, since oxidation-reduction reaction more easier occurs in the second region, the resistance change phenomenon is allowed to more stably occur.

Hereinafter, favorable embodiments of the present invention will be described with reference to accompanying drawings. It should be noted that the embodiments described below are each merely a preferred illustration of the present invention. Values, shapes, materials, components, disposition or a form of connection between the components, steps, and the order of the steps are merely illustrative, and are not intended to limit the present invention. Thus, among components of the below embodiments, components not set forth in the independent claims indicating the top level concept of the present invention are not necessary to achieve the present invention but will be described as arbitrary components composed in preferable embodiments.

[Embodiment 1]

[Configuration of Variable Resistance Element]

The configuration of a variable resistance element included in a nonvolatile memory element according to Embodiment 1 will be described.

FIG. 1 is a cross-sectional view showing a configuration of a variable resistance element 10 included in a nonvolatile memory element according to the present embodiment. As shown in FIG. 1, the nonvolatile memory element 10 according to the present embodiment includes a substrate 1, a bottom electrode 2 formed above the substrate 1, a variable resistance layer 3 formed above the bottom electrode 2, and a top electrode formed above the variable resistance layer 3. The bottom electrode 2 and the top electrode 4 are electrically connected to the variable resistance layer 3.

The substrate 1 comprises a silicon substrate, for example. Moreover, the bottom electrode 2 and the top electrode 4 comprise one or more materials, for example, Au (gold), Pt (platinum), Ir (iridium), Cu (copper), TiN (titanium nitride), TaN (tantalum nitride), and the like.

The variable resistance layer 3 comprises a metal oxide. The variable resistance layer 3, favorably, comprises an oxygen-deficient transition metal oxide. With this, reliable resistance change can be realized. The variable resistance layer 3, more favorably, comprises by stacking a first transition metal oxide layer 3a and a second transition metal oxide layer 3b which has an oxygen content percentage higher than the first transition metal oxide layer 3a. At this time, the second transition metal oxide layer 3b has an oxygen content percentage higher than the first transition metal oxide layer 3a. In other words, the second transition metal oxide layer 3b has an oxygen deficiency lower than the first transition metal oxide layer 3a. Moreover, the transition metal contained in the first transition metal oxide layer 3a and the transition metal contained in the second transition metal oxide layer 3b may be the same or different from each other. It should be noted that after the variable resistance layer 3 is formed as a single layer, the first region corresponding to the first transition metal oxide layer 3a and the second transition metal oxide layer 3b corresponding to the second region may be electrically formed according to a forming process (process of alternately applying a voltage pulse for changing to a high resistance state and a voltage pulse for changing to a low resistance state).

The resistance change phenomenon is believed to occur when a metal oxide having a plurality of oxidation states is changed according to an oxidation-reduction reaction. The oxidation-reduction reaction is caused by the voltage (or the current) applied to the variable resistance layer 3. When a voltage greater than or equal to a predetermined threshold voltage (or current greater than or equal to a predetermined threshold voltage) is applied to the variable resistance layer 3, it is considered that the oxidation-reduction reaction occurs in the variable resistance layer 3 and the resistance is changed. When the variable resistance layer 3 is a stacked structure of the first transition metal oxide layer 3a and the second transition metal oxide layer 3b, the voltage applied to the variable resistance layer 3 is distributed more to the second transition metal oxide layer 3b having a relatively high resistance value, and it is considered that the resistance change phenomenon can be reliably generated in the second transition metal oxide layer 3b. In this case, it is considered that the resistance change does not occur to the whole of the second transition metal oxide layer 3b but occurs to part of the second transition metal oxide layer 3b.

Hereinafter, the following will describe a case where the first transition metal oxide layer 3a is a first tantalum oxide layer 3a and the second transition metal oxide layer 3b is a second tantalum oxide layer 3b, and a case where the variable resistance layer 3 is composed by stacking the first tantalum oxide layer 3a and the second tantalum oxide layer 3b. In other words, the first tantalum oxide layer 3a is composed of an oxygen-deficient tantalum oxide. At this time, the second tantalum oxide layer 3b is higher than the first tantalum oxide layer 3a in oxygen content percentage. In other words, the second tantalum oxide layer 3b is smaller than the first tantalum oxide layer 3a in degree of oxygen deficiency. Here, the degree of oxygen deficiency refers to a ratio of deficient oxygen to the amount of oxygen included in an oxide having a stoichiometric composition in a corresponding transition metal. For example, when the transition metal is tantalum (Ta), a stoichiometric composition of the oxide is represented by $Ta_2O_5$, and can be represented by $TaO_{2.5}$. The degree of oxygen deficiency of $TaO_{2.5}$ is 0%. For example, the degree of oxygen deficiency of the oxygen-deficient tantalum oxide in the composition of $TaO_{1.5}$ is (2.5−1.5)/2.5=40%. Since an oxide with a small degree of oxygen deficiency is closer to an oxide in the stoichiometric composition, the resistance value is high. Meanwhile, since an oxide with a large degree of oxygen deficiency is closer to a metal composed in the oxide, the resistance value is low. Moreover, the oxygen content percentage of $Ta_2O_5$ is a ratio of the number of oxygen atoms relative to the total number of atoms (O/(Ta+O)) is 71.4 atm %. Therefore, the oxygen content percentage of the oxygen-deficient tantalum oxide is greater than 0 and less than 71.4 atm %.

It is desirable that when the composition of the first tantalum oxide layer 3a is $TaO_x$, x is greater than or equal to 0.8 and less than or equal to 1.9. It is desirable that when the composition of the second tantalum oxide layer 3b is TaO$_y$, y is greater than or equal to 2.1 and less than or equal to 2.5. When x and y are in the above described ranges, the resistance value of the variable resistance layer 3 can be reliably changed at a high speed. Therefore, it is desirable that x and y are in the above described ranges.

It is desirable that the thickness of the variable resistance layer 3 is less than or equal to 1 μm in order to obtain a change in the resistance value. Furthermore, the thickness of the variable resistance layer is less than or equal to 200 nm, the formation of the variable resistance layer 3 with a patterning process can be simplified. Moreover, the thickness of the variable resistance layer 3 is less than or equal to 200 nm, it is possible to lower the voltage value of voltage pulse necessary to change the resistance value of the variable resistance layer 3. Meanwhile, in order to certainly avoid a breakdown (dielectric breakdown) when the voltage pulse is applied, it is desirable that the thickness of the variable resistance layer 3 is at least greater than or equal to 5 nm.

Moreover, when the thickness of the second tantalum oxide layer 3b is too large, there is an inconvenience that the initial resistance value is too high. When the thickness of the second tantalum oxide layer 3b is too small, there is an inconvenience that the resistance change cannot be reliably obtained. Therefore, it is favorable that the thickness is from greater than or equal to 1 nm to less than or equal to 8 nm.

It should be noted that as described above, the variable resistance layer 3 may comprise an oxygen-deficient transition metal oxide. For example, a hafnium oxide or a zirconium oxide may be used. When a hafnium oxide is used as an oxygen-deficient transition metal oxide, it is desirable that the oxide content percentage of the second transition metal oxide layer 3b (HfO$_y$) that is a high concentration oxygen content layer is from greater than or equal to 64.3 atm % to less than or equal to 66.7 atm % (1.8<y≤2.0), and that the oxide content percentage of the first transition metal oxide layer 3a (HfO$_x$) that is a low concentration oxygen content layer is from greater than or equal to 47.4 atm % to less than or equal to 61.5 atm % (0.9<y≤1.6). When a zirconium oxide is used as an oxygen-deficient transition metal oxide, it is favorable that the oxide content percentage of the second transition metal oxide layer 3b (ZrO$_y$) that is a high concentration oxygen content layer is from greater than or equal to 65.5 atm % to less than or equal to 66.7 atm % (1.9<y≤2.0), and that the oxide content percentage of the first transition metal oxide layer 3a (ZrO$_x$) that is a low concentration oxygen content layer is from greater than or equal to 47.4 atm % to less than or equal to 58.3 atm % (0.9<y≤1.6).

Moreover, the transition metal composed in the first transition metal oxide layer 3a and the transition metal composed in the second transition metal oxide layer 3b may be different from each other. In other words, the transition metal oxide composed in the variable resistance layer 3 may have the first region including an oxygen-deficient transition metal oxide having a composition represented by MO$_x$ and the second region including an oxygen-deficient transition metal oxide having a composition represented by NO$_y$. Here, the first transition metal is represented by M, and the second transition metal different from the first transition metal is represented by N. As a transition metal, tantalum (Ta), titanium (Ti), hafnium (Hf), zirconium (Zr), niobium (Nb), tungsten (W), and the like can be used. In that case, it is favorable that a standard electrode potential of the second transition metal composed in the second transition metal oxide layer 3b is smaller than a standard electrode potential of the first transition metal 3a composed in the first transition metal oxide layer 3a. When the standard electrode potential is greater, oxidation is more unlikely to take place. In other words, by setting the standard electrode potential of the second transition metal composed in the second transition metal oxide layer 3b to be smaller than the standard electrode potential of the first transition metal comprised in the first transition metal oxide layer 3a, an oxidation-reduction reaction more easily occurs in the second transition metal oxide layer 3b. For example, TiO$_2$ may be used for the second transition metal oxide layer 3b, and an oxygen-deficient tantalum oxide (TaO$_x$, 0.8≤x≤1.9) may be used for the first transition metal oxide layer 3a, Since the standard electrode potential of Ti is −1.63 eV and the standard electrode potential of Ta is −0.6 eV, the resistance change phenomenon in the TiO$_2$ layer more stably occurs.

[Method for Manufacturing Variable Resistance Element]

Next, an example of a method for manufacturing the variable resistance element 10 will be described.

First, above the substrate 1, the bottom electrode 2 (TaN) is formed by a sputtering method. Subsequently, the first tantalum oxide layer 3a is formed above the bottom electrode 2 by what is called a reactive sputtering method in which a Ta target is sputtered in argon gas and oxygen gas. Here, the oxygen content percentage in the first tantalum oxide layer 3a can be easily adjusted by changing a ratio of the oxygen gas flow rate to argon gas. It should be noted that the substrate is not necessarily heated and may have a room temperature.

Next, the topmost surface of the first tantalum oxide layer 3a is oxidized. With the oxidation process, a region having a high oxygen content percentage on the surface of the tantalum oxide layer (the second tantalum oxide layer 3b) is formed. Meanwhile, a region in which the oxidation was not promoted by the oxidation process, in other words, the region other than the second tantalum oxide layer 3b among the tantalum oxide layers, is a region in which the oxygen content percentage is low (the first tantalum oxide layer 3a). The variable resistance layer 3 is composed of the first tantalum oxide layer 3a and the second tantalum oxide layer 3b.

At this time, when a value of x in the composition of the first tantalum oxide layer 3a (TaO$_x$) is adjusted in a range from greater than or equal to 0.8 to less than or equal to 1.9 (0.8≤y≤1.9) and a value of y in the composition of the second tantalum oxide layer 3b (TaO$_y$) is adjusted in a range of greater than or equal to 2.1 (2.1≤y), a reliable resistance change can be realized.

Next, above the variable resistance layer 3, the top electrode 4 (Ir) is formed by a sputtering method.

It should be noted that the sizes and forms of the bottom electrode 2, the top electrode 4, and the variable resistance layer 3 can be adjusted by one or more patterning process conditions.

Through the above described process, the variable resistance element 10 can be obtained.

In an embodiment of a driving method to be described later, the following variable resistance element 10 is used. In the variable resistance element 10, the sizes of the top electrode 4 and the variable resistance layer 3 are set to 0.5 μm×0.5 μm (area of 0.25 μm$^2$), respectively, and the size of a portion in contact with the bottom electrode and the variable resistance layer 3 are set to 0.5 μm×0.5 μm (area of 0.25 μm$^2$). The thicknesses of the top electrode 4 and the bottom electrode 2 are set to 50 nm and 50 nm, respectively. In the composition of the first tantalum oxide layer 3a (TaO$_x$), x=1.57, and in the composition of the second tantalum oxide layer 3b (TaO$_y$), y=2.47. The thickness of the variable resistance layer 3 is set to 50 nm. The thickness of the first tantalum oxide layer 3a is set to 44 nm. The thickness of the second tantalum oxide layer 3b is set to 6 nm.

It should be noted that the second tantalum oxide layer 3b may be formed by performing sputtering in argon gas and oxygen gas, using a tantalum oxide target. A CVD method and an ALD method may used for the formation.

[Characteristics of Variable Resistance Element]

Next, characteristics of the variable resistance element 10 configured as described above will be described.

Figure 2:
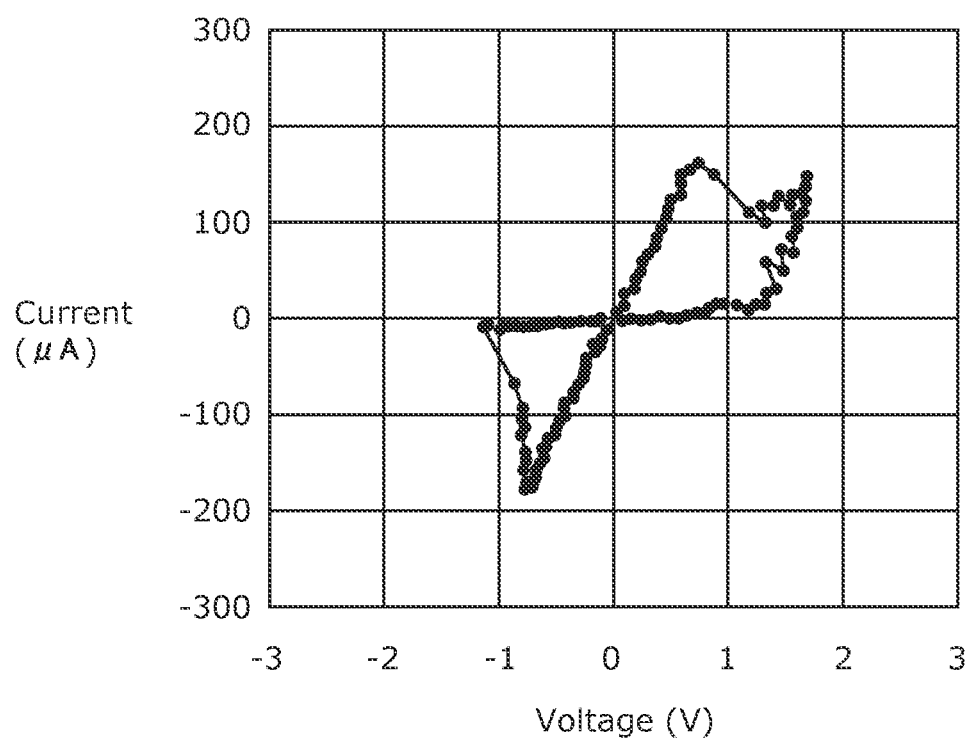
FIG. 2 is a graph showing current-voltage characteristics of a variable resistance element included in a nonvolatile memory element according to Embodiment 1 of the present invention.

FIG. 2 is a graph showing current-voltage characteristics of the variable resistance element 10 included in a nonvolatile memory element 30 according to the present embodiment. The horizontal axis shows a voltage value of the upper electrode 4 with respect to the bottom electrode 2, and the vertical axis shows a current value flowing from the top electrode 4 to the bottom electrode 2. By referring to FIG. 2, when a voltage pulse in which the top electrode has a negative polarity with respect to the bottom electrode 2 is applied to the variable resistance layer 3, it can be found that the current value is higher for changing to a low resistance state. Conversely, when the voltage pulse having a positive polarity is applied to the variable resistance layer 3, it can be found that the current value is lower for changing to a high resistance state.

The mechanism of the resistance change can be estimated as follows. First, in the second tantalum oxide layer 3b, a filament path that is a micro region causing a resistance change is formed. When the voltage pulse in which the top electrode 4 has a positive polarity with respect to the bottom electrode 2, it is considered that the filament path in the second tantalum oxide layer 3b accepts oxygen ions from the first tantalum oxide layer 3a and that the second tantalum oxide layer 3b is changed to a high resistance state. Conversely, when the voltage pulse is applied in which the top electrode 4 has a negative polarity with respect to the bottom electrode 2, it is considered that the filament path in the second tantalum oxide layer 3b diffuses the accepted oxygen ions into the first tantalum oxide layer 3a and the second tantalum oxide layer 3b is changed to a low resistance state.

[Configuration of Nonvolatile Memory Element]

Figure 3:
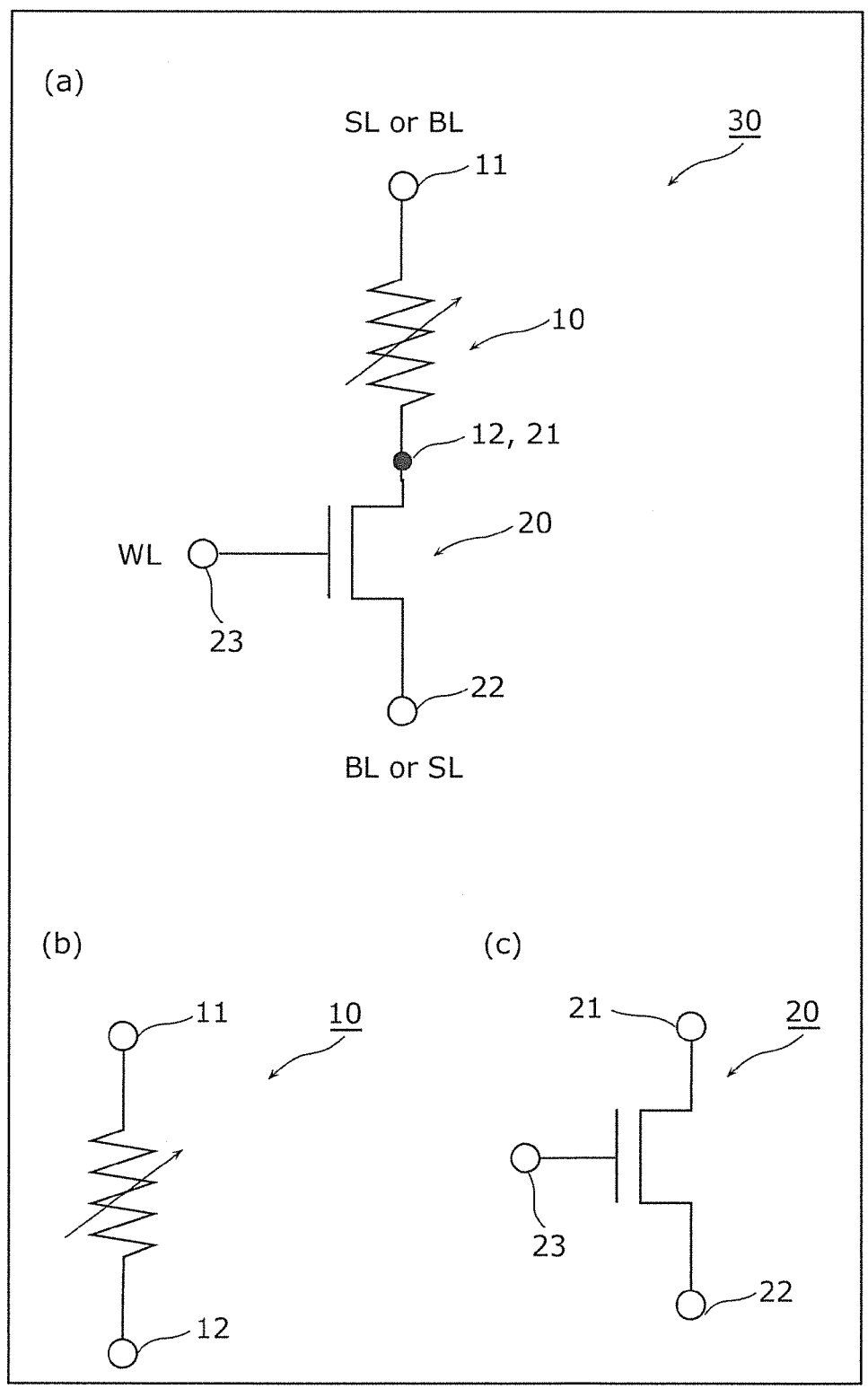
FIG. 3 is a circuit diagram showing an example of a configuration of the nonvolatile memory element according to Embodiment 1 of the present invention. (a) in FIG. 3 is an equivalent circuit diagram of the nonvolatile memory element, (b) in FIG. 3 is a circuit diagram of a variable resistance element included in the nonvolatile memory element, and (c) in FIG. 3 is a circuit diagram of a field-effect transistor included in the nonvolatile memory element.

(a) in FIG. 3 is a circuit diagram showing a configuration of the nonvolatile memory element 30 composed of 1-transistor/1-variable resistance element (1T1R) according to the present embodiment. The nonvolatile memory element 30 includes the variable resistance element 10 and a switching element (field-effect transistor) 20. It should be noted that WL denotes a word line, SL denotes a source line, and BL denotes a bit line.

(b) in FIG. 3 is a circuit diagram of the configuration of the variable resistance element 10 comprised in the nonvolatile memory element 30. (c) in FIG. 3 is a circuit diagram showing the configuration of the field-effect transistor 20 composed in the nonvolatile memory element 30. In other words, when the variable resistance element 10 shown in (b) in FIG. 3 is connected to the field-effect transistor 20 shown in (c) in FIG. 3, the nonvolatile memory element 30 shown in (a) in FIG. 3 can be obtained.

As shown in (b) in FIG. 3, the variable resistance element 10 is an element of a two-terminal structure having a terminal each for the top electrode 4 and the bottom electrode 2. A terminal 12 that is one of the terminals of the variable resistance element 10 is connected to a terminal 21 that is one of the terminals of the field-effect transistor 20. In the present description, of the two terminals included in the variable resistance element 10, a terminal 12 that is one of the terminals that is connected to the field-effect transistor 20 is referred to as the second terminal 12, and the other terminal 11 that is not connected to the field-effect transistor 20 is referred to as the first terminal 11. The circuit diagram code of the variable resistance element 10 shown in (b) in FIG. 3 shows that when the voltage pulse in which the first terminal 11 has a negative polarity with respect to the second terminal 12 is applied to the variable resistance element 10, the variable resistance layer 3 is changed to a low resistance state. Conversely, it is shown that when the voltage pulse with a positive polarity is applied, the variable resistance layer 3 is changed to a high resistance state.

As shown in (c) in FIG. 3, the field-effect transistor 20 is an element which includes at least three elements of a source terminal, a drain terminal, and a gate terminal. In the present description, among these terminals, the one terminal 21 connected to the variable resistance element 10 is referred to as the first input and output terminal 21, and the other terminal 22 which can be conductive, by a transistor operation, to the first input and output terminal 21 is referred to as a second input and output terminal 22. Moreover, in the transistor operation, a terminal 23 which controls conduction between the first input and output terminal 21 and the second input and output terminal 22 is called a gate terminal 23. In the field-effect transistor 20, when it is ON, one of the first input and output terminal 21 and the second input and output terminal 22 works as a source terminal and the other works as a drain terminal. It should be noted that as described in detail later, which of the terminals is a source terminal is determined by a current flowing direction and the polarity of carrier.

The field-effect transistor 20 is, for example, a metal-insulator-semiconductor field-effect transistor (MISFET), or a metal-oxide-semiconductor field-effect transistor (MISFET) which is a type of the MISFET. Hereinafter, to make a story short, there is a case where the field-effect transistor 20 is referred to as only the transistor 20. Moreover, there is a case where the field-effect transistor 20 is specifically referred to as MISFET 20, an N-type MISFET 20, and a P-type MISFET 20 according to the embodiments.

In (b) and (c) in FIG. 3, the description is made separately about the variable resistance layer 10 and the field-effect transistor 20. These are expression on the circuit diagram to make a simple explanation. Therefore, for example, it is acceptable that the variable resistance element 10 and the field-effect transistor 20 are united as a device. For example, the first input and output terminal 21 of the field-effect transistor 20 also serves as the bottom electrode 2 of the variable resistance element 10. Moreover, the second terminal 12 of the variable resistance element 10 and the first input and output terminal 21 may be electrically connected to each other. For example, another material with conductivity may be interposed between the variable resistance element 10 and the field-effect transistor 20.

Figure 4:
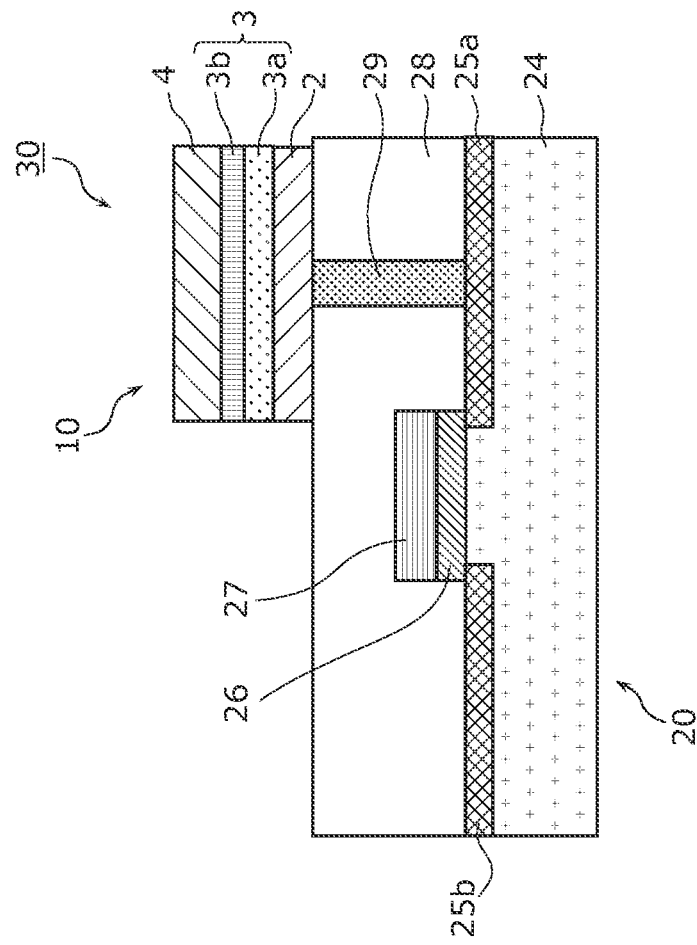
FIG. 4 is a cross-sectional view showing a configuration of the nonvolatile memory element according to Embodiment 1 of the present invention.

FIG. 4 is a cross-sectional view showing an example of the configuration of the nonvolatile memory element 30 according to the present embodiment. The nonvolatile memory element 30 includes the variable resistance element 10 and the field-effect transistor 20. It should be noted that FIG. 4 shows a case where the field-effect transistor 20 is the MISFET 20.

The variable resistance element 10, as similarly to the variable resistance element 10 shown in FIG. 1, includes the bottom electrode 2, the variable resistance layer 3, and the top electrode 4. The variable resistance layer 3 includes the first tantalum oxide layer 3a and the second tantalum oxide layer 3b. Therefore, when a voltage pulse in which the top electrode 4 has a negative polarity with respect to the bottom electrode 2 is applied to the variable resistance layer 3, the variable resistance layer 3 is changed to a low resistance state. Conversely, when the voltage pulse with a positive polarity is applied to the variable resistance layer 3, the variable resistance layer 3 is changed to a high resistance state.

The MISFET 20 includes a semiconductor substrate 24, a first diffusion layer 25a and a second diffusion layer 25b which are disposed above the semiconductor substrate 24, a gate insulating film 26 which is disposed, above the semiconductor substrate 24, to stride over the first diffusion layer 25a and the second diffusion layer 25b, and a gate electrode 27 which is disposed above the gate insulating film 26. It should be noted that when the gate insulating film 26 is an oxide film, the MISFET 20 is also referred to as MOSFET. The MISFET 20 can be formed according to a variety of publicly disclosed methods. Above the MISFET 20, an interlayer dielectric 28 is formed, and a conductive via 29 is formed to connect between the bottom electrode 2 of the variable resistance element 10 and the first diffusion layer 25a of the MISFET 20.

It should be noted that the variable resistance element 10 shown in FIG. 4 may be disposed such that the second tantalum oxide layer 3b is on the upside and the first tantalum oxide layer 3a is on the downside. However, it is acceptable that the second tantalum oxide layer 3b is on the downside and the first tantalum oxide layer 3a is on the upside. In this case, when a voltage pulse in which the top electrode 4 has a negative polarity with respect to the bottom electrode 2 is applied to the variable resistance layer 3, the variable resistance layer 3 is changed to a high resistance state. Conversely, when the voltage pulse having a positive polarity is applied, the variable resistance layer 3 is changed to a low resistance state.

In the MISFET 20, (i) the semiconductor substrate 24 and (ii) the first diffusion layer 25a and the second diffusion layer 25b are opposite conduction types. When the semiconductor substrate 24 is P-type, the first diffusion layer 25a and the second diffusion layer 25b are N-types. In this case, the MISFET 20 is an N-type MISFET. Conversely, when the semiconductor substrate 24 is N-type, the first diffusion layer 25a and the second diffusion layer 25b are P-types. In this case, the MISFET 20 is a P-type MISFET, (a) in FIG. 3 and FIG. 4 show a connection relationship when the MISFET 20 is an N-type MISFET 20. It should be noted that as described later, when the MISFET 20 is a P-type MISFET 20, the top and bottom arrangement of the variable resistance layer 3 is connected such that it is opposite to the top and bottom arrangement of the variable resistance layer 3 when the MISFET 20 is an N-type MISFET 20.

It should be noted that when the MISFET 20 is N-type, a majority carrier is an electron. Meanwhile, when the MISFET 20 is P-type, a majority carrier is a hole. Generally, the electron mobility is larger than the hole mobility. Therefore, when the MISFET 20 is manufactured in the same size and in the same structure of the gate insulating film 26 (material and thickness), the N-type MISFET is greater than the P-type MISFET in current drivability. Therefore, with this aspect, when the MISFET 20 having the same current drivability is manufactured, the N-type MISFET can be smaller than the P-type MISFET in element size.

The cross-sectional structure of the nonvolatile memory element 30 shown in FIG. 4 is an example. In the nonvolatile memory element 30 according to the present embodiment, the structure of the variable resistance element 10, and the structures of the variable resistance element 10 and the connection portion of the field-effect transistor are not limited to such. Hereinafter, in order to simplify the explanation, unless it is explicitly stated otherwise, it is described that the field-effect transistor 20 shown in FIGS. 3 and 4 is the N-type MISFET 20.

[Method for Driving Nonvolatile Memory Element]

Next, a method for driving the variable resistance element 30 configured as described above will be described. It should be noted that it is defined that a state in which the nonvolatile memory element 10 has a resistance value that is a predetermined high value (for example, 20000Ω) is the high resistance state, and a state in which the nonvolatile memory element 10 has the resistance value that is a predetermined low value (for example, 700Ω) is the low resistance state. Moreover, in the present description, a change in the resistance state of the variable resistance element 10 (or the variable resistance layer 3) from the high resistance state to the low resistance state will be denoted as a change to the low resistance state, and a change in the resistance state of the variable resistance element 10 (or the variable resistance layer 3) from the low resistance state to the high resistance state will be denoted as a change to the high resistance state.

In the present embodiment, by applying a voltage using a power source and the like to the nonvolatile memory element 30, the resistance state of the variable resistance layer 3 can be changed as follows.

First, by applying a voltage pulse in which a voltage value is VLR in the first polarity and a pulse width is PWLR to between the first terminal 11 of the variable resistance element 10 and the second input and output terminal 22 of the transistor 20, the variable resistance layer 3 is changed from the high resistance state to the low resistance state. This will be referred to as a writing step. The voltage pulse applied at this time is referred to as a writing voltage pulse, and the current flowing at this time is referred to as a write current. In the present description, the first polarity means a polarity of the voltage pulse necessary to change the variable resistance layer 3 from the high resistance state to the low resistance state. For example, in the case of the connection relationship shown in (a) in FIG. 3 and FIG. 4, the polarity of the voltage in which the potential of the top electrode 4 of the variable resistance element 10 is relatively lower than the potential of the second diffusion layer 25b of the N-type MISFET 20 is the first polarity. At this time, since the voltage applied to the variable resistance element 10 is a voltage in which the top electrode 4 has a negative polarity with respect to the bottom electrode 2, the variable resistance layer 3 is changed from the high resistance state to the low resistance state.

Next, a voltage pulse in which a voltage value is VHR and a pulse width is PWHR in the first polarity different from the second polarity is applied to between the first terminal 11 of the variable resistance element 10 and the second input and output terminal 22 of the transistor 20. With this, the variable resistance layer 3 is changed from the low resistance state to the high resistance state. This will be referred to as an erasing step. The voltage pulse applied at this time is referred to as an erasing voltage pulse, and the current flowing at this time is referred to as an erasing current. In the present description, the second polarity means a polarity of the voltage pulse necessary to change the variable resistance layer 3 from the low resistance state to the high resistance state. For example, in the case of the connection relationship shown in (a) in FIG. 3 and FIG. 4, the polarity of the voltage in which the potential of the top electrode 4 of the variable resistance element 10 is relatively higher than the potential of the second diffusion layer 25b of the N-type MISFET 20 is the second polarity. At this time, since the voltage applied to the variable resistance element 10 is a voltage in which the top electrode 4 has a positive polarity with respect to the bottom electrode 2, the variable resistance layer 3 is changed from the low resistance state to the high resistance state.

By repeating the above described writing step and erasing step, the nonvolatile memory element 30 is operated.

Whether the variable resistance layer 3 is in the low resistance state or the high resistance state is determined by the application of a writing voltage pulse with a predetermined value (hereinafter referred to as read voltage pulse). Specifically, by applying the read voltage pulse to between the first terminal 11 of the variable resistance element 10 and the second input and output terminal 22 of the transistor 20, it is determined whether the variable resistance element 10 is in the high resistance state or the low resistance state, according to the current value of the current flowing in the variable resistance layer 3 at this time (hereinafter referred to as the read voltage).

The magnitude of the value (absolute value) applied to the variable resistance element 10 by the read voltage pulse is smaller than that of a threshold voltage which brings a resistance change to the variable resistance layer 3. Therefore, the read voltage pulse does not influence the resistance state of the variable resistance element 10. For example, in the case where the variable resistance layer 3 is in the low resistance state and even when the read voltage pulse having the first polarity is applied to between the variable resistance layer 10 and the transistor 20, the resistance state of the variable resistance layer 3 is not changed and is maintained in the low resistance state. Similarly, in the case where the variable resistance layer 3 is in the high resistance state and even when the read voltage pulse having the second polarity is applied to between the variable resistance layer 10 and the transistor 20, the resistance state of the variable resistance layer 3 is not changed and is maintained at the high resistance state.

When the above described driving method is performed on the nonvolatile memory element 30 according to the present embodiment, the nonvolatile memory element 30 can be used as a memory cell. For example, by corresponding "1" to when the variable resistance layer 3 is in the low resistance state and "0" to when the variable resistance layer 3 is in the high resistance state, a one-bit memory cell is realized.

[Connection Relationship of Nonvolatile Memory Element, and]Body Effect

The nonvolatile memory element 30 according to the present embodiment, in a writing step, is connected such that the first input and output terminal 21 is a source terminal. In other words, in the writing step, among the terminals of the field-effect transistor 20, a terminal connected to the variable resistance element 10 is the source terminal.

In the present description, the source means a supply source of majority carriers in the field-effect transistor 20. Meanwhile, the drain means an intake of majority carriers in the field-effect transistor 20. When one of the first input and output terminal 21 and the second output and input terminal 22 is the source terminal, the other is the drain terminal. Similarly, one of the first diffusion layer 25a and the second diffusion layer 25b is the source region, the other is the drain region. It should be noted that when the field-effect transistor 20 is N-type, the majority carrier is an electron. Meanwhile, when the field-effect transistor 20 is P-type, the majority carrier is a hole.

When a current flows bidirectionally like the field-effect transistor 20 according to the present embodiment, the source and the drain are switched according to a direction of the current, in the present embodiment, since the polarity of the voltage applied to the nonvolatile memory element 30 is opposite between the writing step and the erasing step, the source and the drain are accordingly reversed. In other words, the source or the drain in the writing step is the drain or the source in the erasing step.

When the field-effect transistor 20 is the N-type MISFET 20 and when ON current flows from the first input and output terminal 21 to the second input and output terminal 22, the first input and output terminal 21 is a drain terminal and the second input and output terminal 22 is a source terminal. When ON current flows from the second input and output terminal 22 to the first input and output terminal 21, the first input and output terminal 21 is a source terminal and the second input and output terminal 22 is a drain terminal.

When the field-effect transistor 20 is the P-type MISFET 20 and when ON current flows from the first input and output terminal 21 to the second input and output terminal 22, the first input and output terminal 21 is a source terminal and the second input and output terminal 22 is a drain terminal. Meanwhile, when ON current flows from the second input and output terminal 22 to the first input and output terminal 21, the first input and output terminal 21 is a drain terminal and the second input and output terminal 22 is a source terminal.

When the field-effect transistor 20 is the N-type MISFET 20, the writing voltage pulse in the writing step applied to the nonvolatile memory element 30 in (a) in FIG. 3 and FIG. 4, as described above, is a voltage pulse in which the potential of the top electrode 4 in the variable resistance element 10 (the potential of the first terminal 11) is relatively low with respect to the potential of the second diffusion layer 25b of the N-type MISFET 20 (the potential of the second input and output terminal 22). At this time, the current flows from the second input and output terminal 22 to the first input and output terminal 21, the second terminal 12, and the first terminal 11, in that order. In other words, in the writing step, the first input and output terminal 21 of the N-type MISFET 20 is a source terminal.

Similarly, since in the erasing step, the erasing voltage pulse applied to the nonvolatile memory element 30 in (a) in FIG. 3 and FIG. 4 is opposite in voltage polarity compared with the case of the writing step, the second input and output terminal 22 of the N-type MISFET 20 is a source terminal.

As described later, the top and bottom arrangement of the variable resistance layer 3 when the field-effect transistor 20 is the P-type MISFET 20 is opposite to that when the field-effect transistor 20 is the field-effect transistor 20 is the P-type MISFET 20. Therefore, the writing voltage pulse, in the writing step, applied to the nonvolatile memory element 30 is a voltage pulse in which the potential of the top electrode 4 in the variable resistance element 10 (the potential of the first terminal 11) is relatively high with respect to the potential of the second diffusion layer 25b of the P-type MISFET 20 (the potential of the second input and output terminal 22). At this time, the current flows from the first terminal 11 to the second terminal 12, the first input and output terminal 21, and the second input and output terminal 22, in that order. At this time, the majority carrier flowing in the P-type MISFET 20 is a hole. Therefore, in the writing step, the first input and output terminal 21 of the P-type MISFET 20 is a source terminal.

Similarly, since in the erasing step, the erasing voltage pulse applied to the nonvolatile memory element 30 is opposite in voltage polarity compared with the case of the writing step, the second input and output terminal 22 of the P-type MISFET 20 is a source terminal.

The following will describe a connection relationship of the nonvolatile memory element 30 and its relationship with body effect with reference to the nonvolatile memory element 30 in (a) in FIG. 3 and FIG. 4. The influence of the body effect to be described later will be described as the case where the field-effect transistor 20 is the N-type MISFET 20. As described later, the case is not limited to the case where the field-effect transistor 20 is the N-type MISFET 20.

In the writing step, the writing voltage provides a relatively low potential to the first terminal 11 of the variable resistance element 10, and provides a relatively high potential to the second input and output terminal 22 of the N-type MISFET 20. At this time, the source potential of the N-type MISFET 20 (the potential of the first input and output terminal 21) is determined by a voltage dividing relationship between an ON resistance value of the N-type MISFET 20 and a resistance value of the variable resistance element 10. Specifically, the source potential is higher by a voltage rise by the variable resistance element 10, compared with the case of the first terminal 11 of the variable resistance element 10. With this, the influence of the body effect is large in the N-type MISFET 20, and an ON current value of the N-type MISFET 20 is limited. As a result, a current value flowing in the variable resistance element 10 that is connected to the N-type MISFET 20 is also limited.

Meanwhile, in the erasing step, the source potential of the N-type MISFET 20 (the potential of the second input and output terminal 22) is not influenced by a voltage drop by the variable resistance element 10, and is determined with the potential applied to the second input and output terminal 22. This is because the source terminal of the N-type MISFET 20 (the second input and output terminal 22) is one end of the volatile memory element 30. For example, the source potential of the N-type MISFET 20 (the potential of the second input and output terminal 22) is maintained almost equal to the potential of the semiconductor substrate 24. Therefore, the influence of the body effect caused in the MISFET 20 is small, and the ON current value of the N-type MISFET 20 can be relatively great. As a result, a current value flowing in the variable resistance element 10 that is connected to this can be relatively great.

The present embodiment defines a connection relationship and a driving method in which the write current in the writing step is limited and a larger erasing current is caused to flow in the erasing step. With this, resistance change of the variable resistance element 10 can be reliably obtained. The following will describe the reason.

In the writing step, when the magnitude of the voltage value applied to the variable resistance layer 3 is greater than or equal to a threshold necessary to change to the low resistance state, the resistance value of the variable resistance layer 3 decreases rapidly and the current value of the write current flowing in the variable resistance element 10 increases rapidly. At this time, when the current value is limited using the body effect, these developments can be confined to an appropriate state. As a result, the resistance value of the low resistance state can be confined to a constant low resistance value.

On the other hand, in the erasing step, in order to make the variable resistance layer 3, the erasing current needs to have an absolute value of the current value that is greater than the write current (the current which receives restriction at the time of a change to the low resistance state) and needs to a current with a polarity opposite to that of the write current. Therefore, by reducing the body effect of the transistor and increasing the current value in the transistor, the high resistance state can be generated stably.

Figure 5:
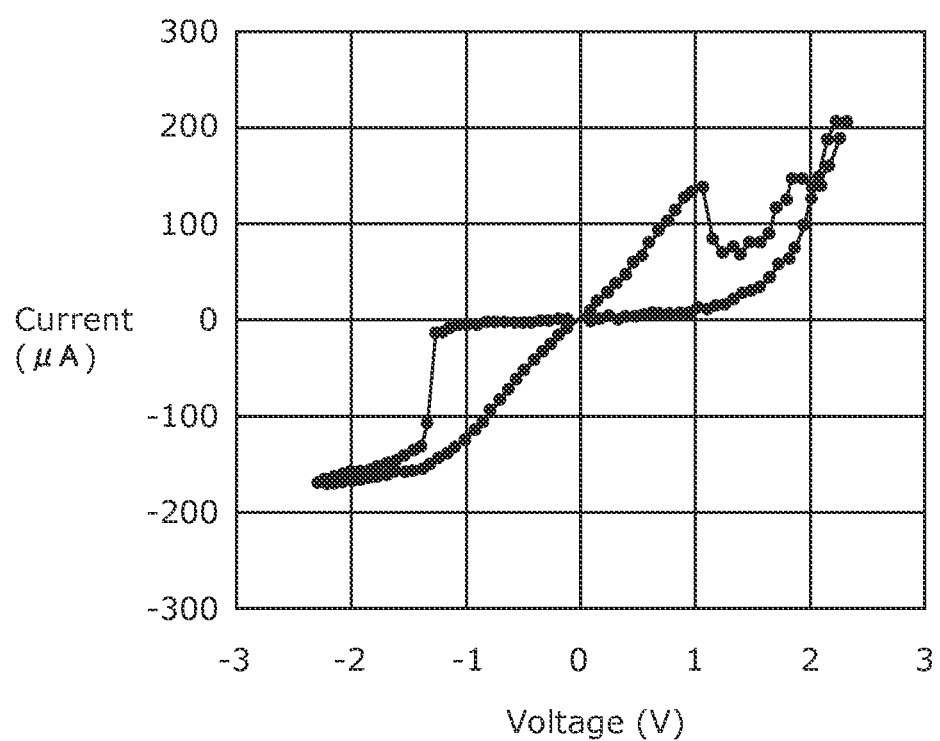
FIG. 5 is a graph showing current-voltage characteristics of the nonvolatile memory element according to Embodiment 1 of the present invention.

FIG. 5 is a graph showing current-voltage characteristics of the nonvolatile memory element 30 according to the present embodiment. As described above, in the nonvolatile memory element 30 according to the present embodiment, since a voltage pulse having a voltage value greater than or equal to a certain value (the voltage with an absolute value of greater than −1.8 V in FIG. 5) is applied when the variable resistance element 10 is changed to the low resistance state, the current value flowing in the variable resistance element 10 is limited and therefore the variable resistance element 10 stays at an almost low resistance state (the current value is around −170 μA). Even when the voltage applied to the nonvolatile memory element 30 is increased, the current flowing in the nonvolatile memory element 30 is almost constant. This is because the transistor serves as a constant current power source. Moreover, when a current (about 210 μA) with a current value that flows in the variable resistance element 10 in a change to the low resistance state when the variable resistance element 10 is changed to the high resistance state is caused to flow in the variable resistance element 10, a more stable high resistance state appears.

[Other Configurations of Nonvolatile Memory Element]

When a stable resistance change is developed using the above described body effect, the nonvolatile memory element 30, in the writing step, may be connected such that the first input and output terminal 21 is a source terminal (so called source follower connection). Therefore, the nonvolatile memory element 30 is not only defined by the configurations in FIGS. 3 and 4. The following will describe other examples of connection.

Figure 6:
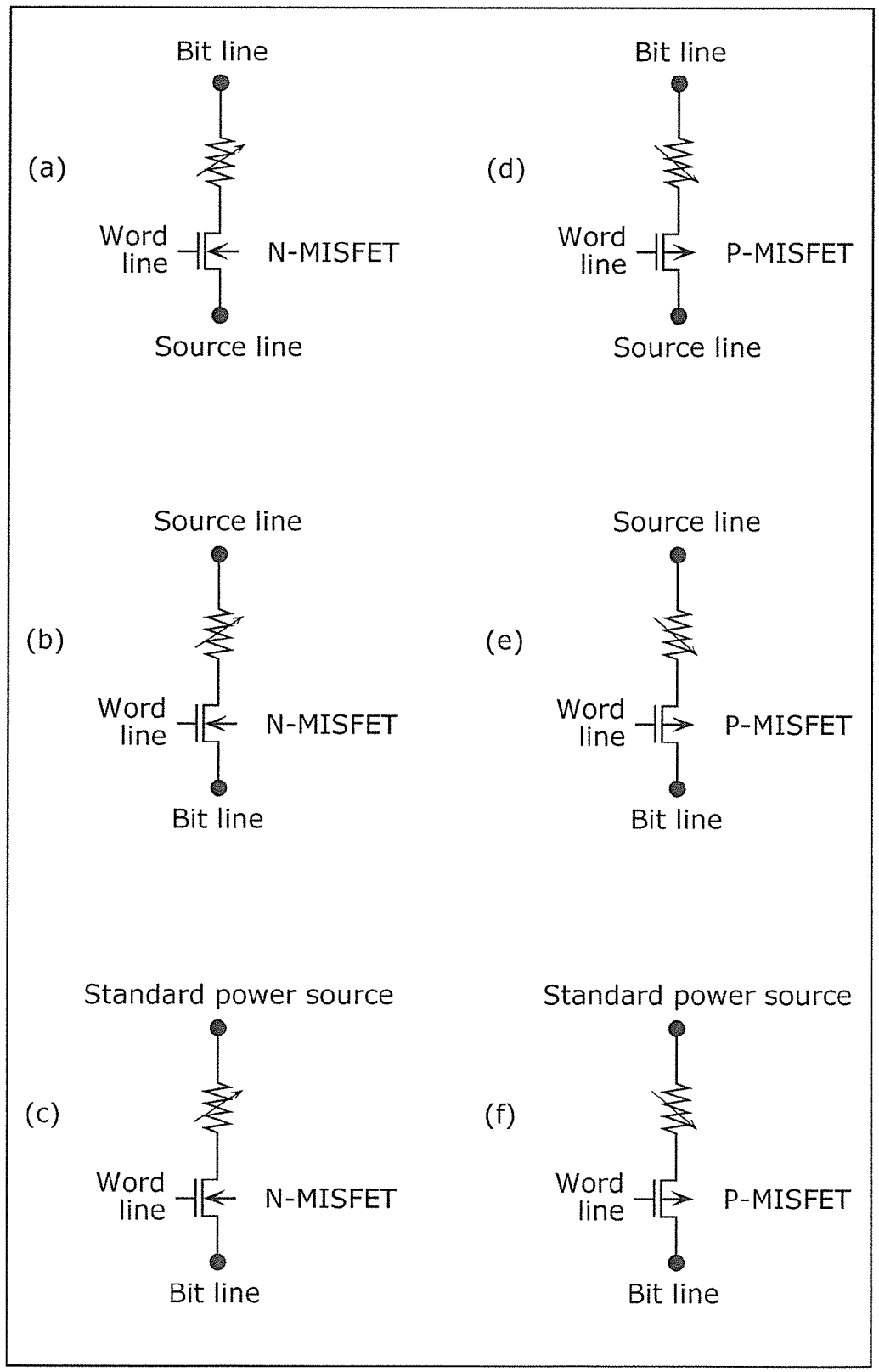
FIG. 6 is a cross-sectional view showing an example of a configuration of the nonvolatile memory element according to Embodiment 1 of the present invention.

(a) to (f) in FIG. 6 are each a circuit diagram showing the nonvolatile memory element 30 which is connected such that the first input and output terminal 21 is a source terminal, including the nonvolatile memory element 30 described in FIG. 3.

(a) to (c) in FIG. 6 are each the nonvolatile memory element 30 including the N-type MISFET 20 as the field-effect transistor 20. At this time, the polarity of the writing voltage pulse applied to the nonvolatile memory element 30 is a polarity in which the potential of the second input and output terminal 22 of the N-type MISFET 20 is higher than the potential of the first terminal 11 of the variable resistance element 10. Moreover, the variable resistance element 10 in (a) to (c) in FIG. 6 may be an element which satisfies the condition that when a voltage pulse in which the first terminal 11 has a negative polarity with respect to the second terminal 12 is applied to the variable resistance element 10, the variable resistance layer 3 is changed to the low resistance state, and that when a voltage pulse having a positive polarity is applied to the variable resistance element, the variable resistance layer 3 is changed to the high resistance state. It should be noted that it is desirable that the variable resistance element 10, in the writing step (a change of the variable resistance element 10 to the low resistance state), is an element which determines the resistance value in the low resistance state depending on the current value flowing in the variable resistance element 10. This is aimed at using the effect of current limit by the body effect.

(a) in FIG. 6 shows the configuration of the variable resistance element 10, and an example of connection of the variable resistance element 10 and the N-type MISFET when the field-effect transistor 20 is the N-type MISFET in the configuration of FIG. 3. (b) in FIG. 6 shows an example of connection of the variable resistance element 10 and the N-type MISFET when the configuration of the variable resistance element 10 is the same as the configuration of (a) in FIG. 6, and the connection relationship between the bit line and the source line is opposite to that of (a) in FIG. 6. (c) in FIG. 6 shows an example of connection of the variable resistance element 10 and the N-type MISFET when the configuration of the variable resistance element 10 is the same as the configuration of (a) in FIG. 6, and the source line is connected to a standard power source which provides a fixed standard voltage. In this case, the write state is controlled by increasing or decreasing the bit line voltage with respect to the standard voltage.

(d) to (f) in FIG. 6 are each the nonvolatile memory element 30 including the P-type MISFET 20 as the field-effect transistor 20. When the P-type MISFET 20 is used, the variable resistance element 10 is inversely connected compared with the case of the variable resistance element 10 shown in (a) to (c) in FIG. 6. This is because the regulation of source and drain with respect to a direction of current in the P-type MISFET 20 is opposite to the regulation of source and drain in a direction of current in the N-type MISFET 20. By selecting this connection relationship, the body effect can be increased in the writing step, while the body effect can be decreased in the erasing step.

When the field-effect transistor 20 includes the P-type MISFET 20, the polarity of the writing voltage pulse applied to the nonvolatile memory element 30 is a polarity in which the potential of the second input and output terminal 22 of the P-type MISFET 20 is lower than the potential of the first terminal 11 of the variable resistance element 10. Moreover, the variable resistance element 10 shown in (d) to (f) in FIG. 6 may be an element which satisfies the condition that when a voltage pulse in which the first terminal 11 has a positive polarity with respect to the second terminal 12 is applied to the variable resistance element 10, the variable resistance layer 3 is changed to the low resistance state, and that conversely, when a voltage pulse with a negative polarity is applied toe variable resistance element 10, the variable resistance layer 3 is changed to the high resistance state. It should be noted that it is desirable that the variable resistance element 10, in the writing step (a change of the variable resistance element 10 to the low resistance state), is an element which determines the resistance value in the low resistance state depending on the current value flowing in the variable resistance element 10. This is aimed at using the effect of current limit by the body effect.

In the variable resistance element 10 shown in (d) in FIG. 6, the voltage polarity and the direction of current in the writing step and the erasing step are opposite to the case of the variable resistance element 10 shown in (a) in FIG. 6. In this case, the substrate voltage of the P-type MISFET, for example, a high potential such as a power source voltage VDD, is provided. Moreover, when the nonvolatile memory element 30 in (d) in FIG. 6 is used as a memory cell, the voltage polarity applied to the word line when selecting the memory cell is opposite to the voltage polarity when the nonvolatile memory element 30 in (a) in FIG. 6 is used as a memory cell. The other control methods is the same as the method when it comprises the N-type MISFET in (a) in FIG. 6. (e) in FIG. 6 shows an example of connection of the variable resistance element 10 and the P-type MISFET 20 when the configuration of the variable resistance element 10 is the same as the configuration of (d) in FIG. 6, and the connection relationship between the bit line and the source line is opposite to that of (d) in FIG. 6, (f) in FIG. 6 shows an example of connection of the variable resistance element 10 and the P-type MISFET 20 when the configuration of the variable resistance element 10 is the same as the configuration of (e) in FIG. 6, and the source line is connected to a standard power source which provides a fixed standard voltage. In this case, the write state is controlled by increasing or decreasing the bit line voltage with respect to the standard voltage.

It should be noted that the nonvolatile memory element 30 shown in (a) to (f) in FIG. 6 is mere example. The present embodiment can be applied to other connection examples. For example, in (c) and (f) in FIG. 6, by reversing the bit line and the standard potential, the standard power source can be connected to the second input and output terminal 22 of the field-effect transistor 20.

Figure 7:
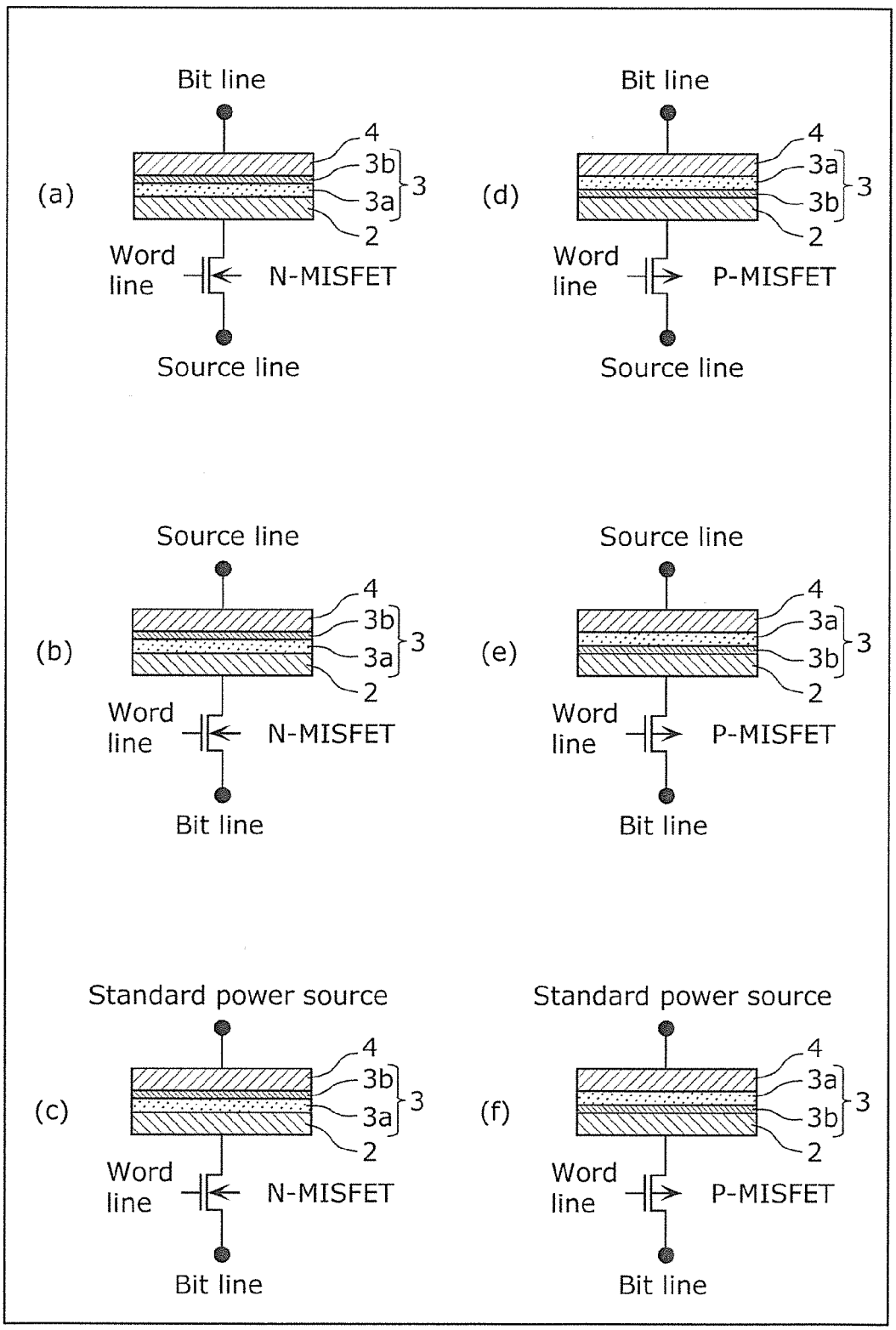
FIG. 7 is a cross-sectional view showing an example of a configuration of the nonvolatile memory element according to Embodiment 1 of the present invention.

(a) to (f) in FIG. 7 are each a cross-sectional view showing an example of the configuration of the variable resistance element 10 for implementing the circuits shown in (a) to (f) in FIG. 6, respectively. (a) to (c) in FIG. 7, for example, as similarly to the configuration shown in FIG. 2, in the variable resistance layer 3, includes the second tantalum oxide layer 3b with high oxygen content percentage on the side of the top electrode 4 and the first tantalum oxide layer 3a with low oxygen content percentage on the side of the bottom electrode 2. (d) to (f) in FIG. 7, for example, as opposed to the configuration shown in FIG. 2, in the variable resistance layer 3, includes the first tantalum oxide layer 3a with low oxygen content percentage on the side of the top electrode 4 and the second tantalum oxide layer 3b with high oxygen content percentage on the side of the bottom electrode 2.

It should be noted that the configuration of the variable resistance element 10 according to the present embodiment is not limited to such. As described above, connection may be made to ensure that the first input and output terminal 21 is a source terminal. The connection relationship is determined with the polarity of the voltage pulse applied to the variable resistance element 10 (direction of current) and a direction of a resistance change of the variable resistance element 10. In other words, the configuration of the variable resistance element 10 may be any configuration. As long as it is the variable resistance element 10 of a bipolar drive, the connection relationship can be selected and applied where appropriate. Therefore, the variable resistance layer 3 may be a single-layer and a stacked structure having two or more layers. Moreover, as the material of the variable resistance layer 3, not only a tantalum oxide but also a perovskite metal oxide such as PCMO can be used. When the variable resistance layer 3 is a single layer, a high resistance layer may be electrically formed by a forming process (for example, a process of alternately applying a voltage pulse for changing to the high resistant state and a voltage pulse for changing to the low resistance state).

As a material in which the resistance value of the low resistance state of the variable resistance layer 3 depends on the current value flowing in the variable resistance layer 3, not only tantalum oxide but also an oxygen-deficient transition metal oxide such as zirconium (Zr) oxide and hafnium (Hf) oxide can be used. The oxygen-deficient transition metal oxide is a transition metal oxide having less oxygen content than the composition of a transition metal oxide (usually an insulating body) having a stoichiometric composition. These materials can be composed of a stacked structure. In the stacked structure, by setting an appropriate oxygen content percentage, a good resistance change can be realized. Moreover, the direction of a resistance change of the variable resistance layer 3 (a change to the low resistance state or a change to the high resistance state) can be previously determined.

Moreover, when employing a stacked structure comprising zirconium oxides, and a composition of a first zirconium oxide is represented by $ZrO_x$ and a composition of a second zirconium oxide is represented by $ZrO_y$, it is preferable that x is in a range from greater than or equal to 0.9 to about less than or equal to 1.4 and y is in a range from greater than or equal to 1.8 to less than or equal to 2.0.

Moreover, when employing a stacked structure comprising hafnium oxides, and a composition of a first hafnium oxide is represented by $HfO_x$ and a composition of a second hafnium oxide is represented by $HfO_y$, it is preferable that x is in a range from greater than or equal to 0.9 to less than or equal to 1.6 and y is in a range from greater than or equal to 1.89 to less than or equal to 1.97.

[Drive Voltage of Nonvolatile Memory Element]

In the present embodiment, when the pulse width of the writing voltage pulse is PWLR and the pulse width of the erasing voltage pulse is PWHR, the pulse widths satisfy PWLR<PWHR. With this, since the high resistance state of the variable resistance layer 3 at the time of erasing can be the high resistance state having less leakage current and being precision. Therefore, even when the write current value is limited by the body effect, an effective voltage for changing to the low resistance state can be sufficiently applied to the variable resistance layer 3. As a result, good endurance characteristics can be realized. In other words, it is possible to keep the resistance value in a low variable resistance state at a constant value by the body effect, and to apply a sufficient effective voltage for resistance change.

Conversely, when a relationship of the pulse widths is PWLR>PWHR, the high resistance state of the variable resistance layer 3 is a high resistance state having relatively large leakage current and having insufficient precision. Therefore, an effective voltage for changing the variable resistance layer 3 to the low resistance state cannot be sufficiently applied at the time of write, with the result that a phenomenon is caused in which the variable resistance layer 3 retains the high resistance state and fails to change to the low resistance state (hereinafter, referred to as held HR error).

Moreover, when the variable resistance layer 3 comprises tantalum oxide, it is desirable that the absolute values of the writing voltage pulse and the erasing voltage pulse satisfy |VLR|=|VHR|. With this, better endurance characteristics can be obtained.

Hereinafter, a relationship between (i) the writing voltage pulse and the erasing voltage pulse applied to the nonvolatile memory element 30 and (ii) endurance characteristics will be described with reference to the following examples.

Figure 8:
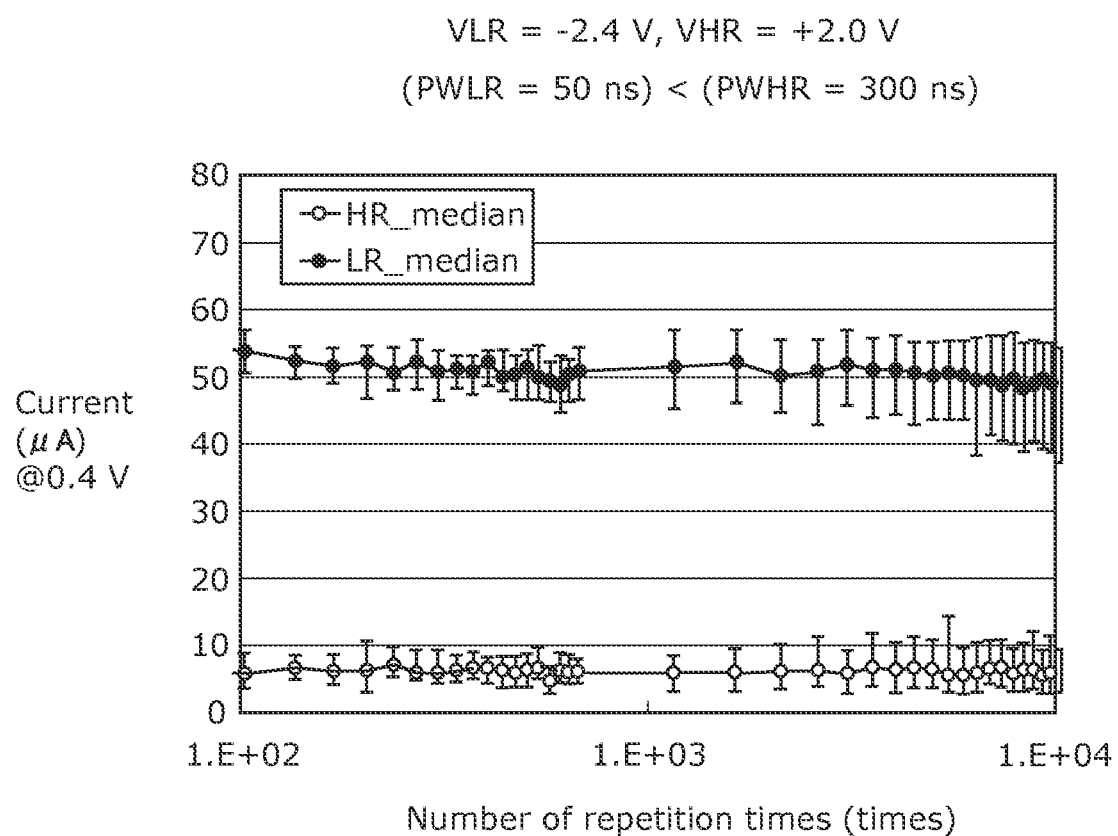
FIG. 8 is a graph showing endurance characteristics of the variable resistance element when a voltage value VLR of writing voltage pulse is −2.4 V, a pulse width PWLR is 50 ns, a voltage value VHR of erasing voltage pulse is +2.0 V, a pulse width PWLR is 50 ns, and a pulse width PWHR is 300 ns.
Figure 9:
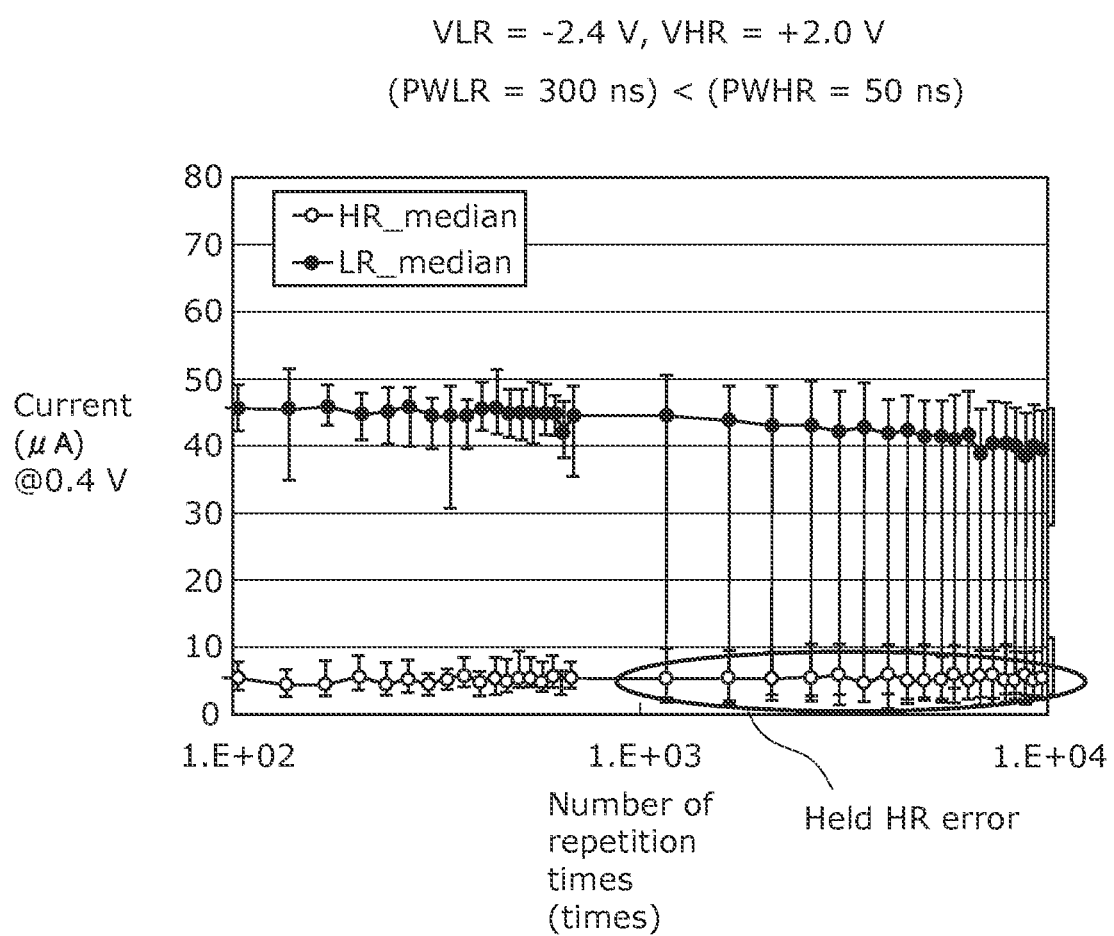
FIG. 9 is a graph showing endurance characteristics of the variable resistance element when a voltage value VLR of writing voltage pulse is −2.4 V, a pulse width PWLR is 300 ns, a voltage value VHR of erasing voltage pulse is +2.0 V, and a pulse width PWHR is 50 ns.
Figure 10:
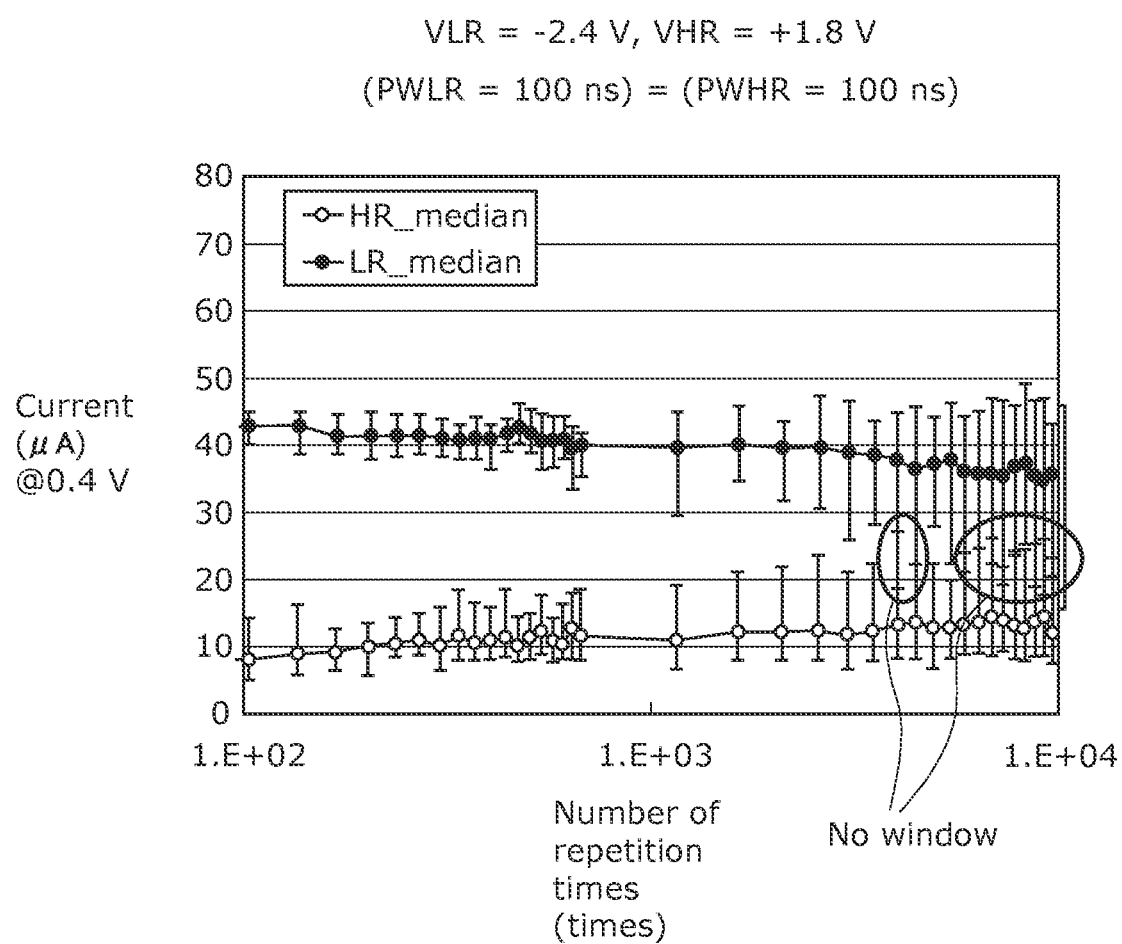
FIG. 10 is a graph showing endurance characteristics of the variable resistance element when a voltage value VLR of writing voltage pulse is −2.4 V, a pulse width PWLR is 100 ns, a voltage value VHR of erasing voltage pulse is +1.8 V, and a pulse width PWHR is 100 ns.

FIGS. 8 to 10 show results of endurance characteristics of the variable resistance layer 3 when the voltage value VLR and the pulse width PWLR of the writing voltage pulse, and the voltage value VHR and the pulse width PWHR of the erasing voltage pulse are changed. FIG. 8 is a graph showing endurance characteristics of the variable resistance element 3 when the voltage value VLR of the writing voltage pulse is −2.4 V and the pulse width PWHR is 50 ns, and the voltage value VHR of the erasing voltage pulse is +2.0 V and a pulse width PWHR is 300 ns. FIG. 9 is a graph showing endurance characteristics of the variable resistance element 3 when the voltage value VLR of the writing voltage pulse is −2.4 V and the pulse width PWLR is 300 ns, and the voltage value VHR of the erasing voltage pulse is +2.0 V and the pulse width PWHR is 50 ns. FIG. 10 is a graph showing endurance characteristics of the variable resistance element 3 when the voltage value VLR of the writing voltage pulse is −2.4 V and the pulse width PWLR is 100 ns, and the voltage value VHR of the erasing voltage pulse is +1.8 V and the pulse width PWHR is 100 ns. Moreover, the number of repetition times in a horizontal axis is denoted by logarithm. For example, 1.E+0.2 is 100, 1.E+03 is 1000, 1.E+04 is 10000.

It should be noted that in the present embodiment, the nonvolatile memory element 30 shown in (a) in FIG. 6 and (a) in FIG. 7 are used. In other words, the field-effect transistor 20 is the N-type MISFET 20. Moreover, in the present embodiment, a gate voltage Vg of the N-type MISFET 20 is 2.4 V.

In FIGS. 8 to 10 to be described later, the vertical axis shows a current value of a read current flowing when the read voltage (0.4 V) is applied to the nonvolatile memory element 30, and the horizontal axis shows the number of repetition times when the writing step and the erasing step are alternately repeated. It should be noted that in the number of repetition times, one cycle of the writing step and the erasing step is counted as one time.

In FIGS. 8 to 10, each of the points in the graph, for convenience sake, shows a distribution of the read current values in a plurality of times for each one point. Specifically, when the number of repetition times is from 100 to 1000, the distribution of current values of the read current when the writing step and the erasing step are repeated 34 times is shown for each of the points, When the number of repetition times is from 1000 to 10000, the distribution of current values of the read current when the writing step and the erasing steps are repeated 490 times is shown for each of the points. Hereinafter, 10000 times which is determined as the standard number of repetition times in the present embodiment is referred to as "the standard number of endurance times".

In FIGS. 8 to 10, each of the bars for a corresponding one of the points denotes the distribution of current values of read current, and a circle for each of the points denotes a median of the current values. A black circle denotes a median of the current values of write current when the writing step is performed, and a white circle denotes a median of the current values of read current when the erasing step is performed.

FIG. 8 is a graph showing endurance characteristics of the variable resistance layer 3 when PWLR is 50 ns and PWHR is 300 ns (PWLR<PWHR). As shown in FIG. 8, held HR error does not occur until 10000 times that is the standard number of endurance times, and the existence of a window is maintained. This shows that in the case of PWLR<PWHR, good endurance characteristics can be realized.

FIG. 9 is a graph showing endurance characteristics of the variable resistance layer 3 when PWLR is 300 ns and PWHR is 50 ns (PWLR>PWHR).

As shown in FIG. 9, before the number of repetition times reaches 10000 times that is the standard number of endurance times, a change from the high resistance state to the low resistance state does not take place even after the writing step is performed, and there is a phenomenon in which the high resistance state remains as it is (refer to the place where "held HR error" is noted in FIG. 9). This shows that as described above, in the case of PWLR>PWHR, the held HR error occurs, and endurance characteristics are degraded.

FIG. 10 is a graph showing endurance characteristics of the variable resistance layer 3 when PWLR is 100 ns and PWHR is 100 ns (PWLR=PWHR). As shown in FIG. 10, until the number of repetition times is 10000 that is the standard number of endurance times, held HR error does not occur. However, as shown in FIG. 10, before the number of repetition times reaches 10000 times that is the standard number of endurance times, there is a state in which the bar extending downward from the black circle and the bar extending upward from the white circle are adjacent or overlapped each other. (refer to the place where "no window" is noted in FIG. 10). Hereinafter, that both bars are adjacent to or overlapped each other is referred to as "no window", and that both bars are sufficiently distant from each other is referred to as "window exits". When the state of no window occurs, it is difficult to distinguish the low resistance state from the high resistance state, with the result that read error and the like may occur. Therefore, the example of FIG. 10 shows a decrease in the stability of memory operation caused by the read error and the like.

FIGS. 11 to 14 are each a graph showing a result of whether or not endurance characteristics are good, based on compiling the vertical axis as PWHR and the horizontal axis as PWHR from the results obtained from a change in the combination of PWLR and PWHR. Here, the case where held HR error does not occur until 10000 times that is the standard number of endurance times and drive is performed when the window exists is denoted by a white circle, the case where although held HR error does not occur until 10000 times that is the standard number of endurance times, the state of no window occurs is denoted by a black triangle, and the case where held HR error occurs at a time of less than 10000 times is denoted by x.

FIGS. 11 to 14 are graphs showing endurance characteristics of the variable resistance layer 3 when the voltage values VLR of the writing voltage pulse are all set to −2.4 V, the voltage values of the erasing voltage pulse are set to +2.4 V, +2.2 V, +2.0 V, and +1.8 V, respectively. Moreover, the gate voltage Vg of the field-effect transistor 20 is set to 2.4 V for all cases.

Figure 11:
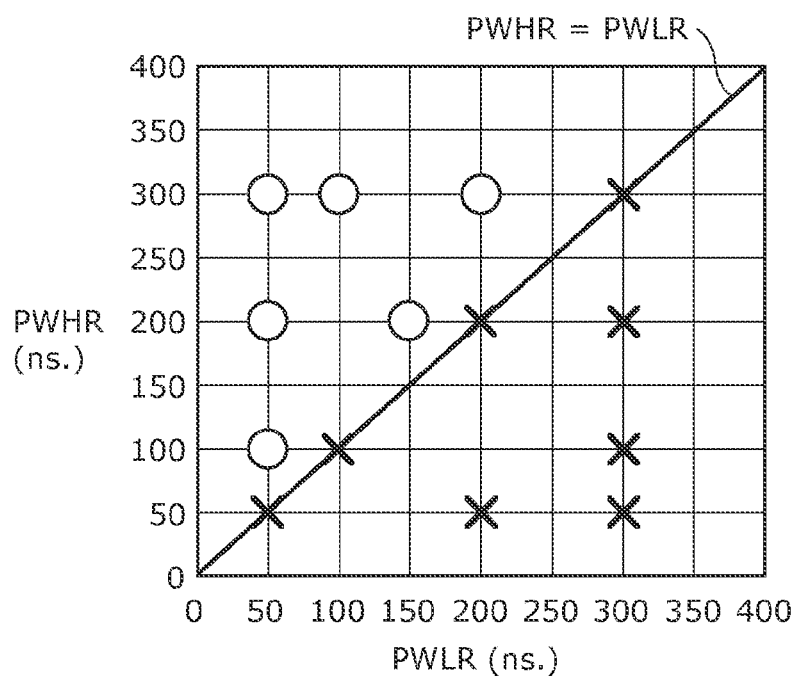
FIG. 11 is a graph showing whether endurance characteristics of the variable resistance element are good or bad when a voltage value VLR of writing voltage pulse is −2.4 V, and a voltage value VHR of erasing voltage pulse is +2.4 V.

FIG. 11 is a graph showing endurance characteristics of the variable resistance layer 3 satisfying (|VLR|=|VHR|) when the voltage value VLR of writing voltage pulse is −2.4 V, and the voltage value VHR of erasing voltage pulse is +2.4 V. As shown in FIG. 11, in the case of PWHR=PWLR and PWLR>PWHR, held HR error occurs at a time of less than the standard number of endurance times (x marks in FIG. 11). In the case of PWLR<PWHR, no held HR errors occurs until reaching the standard number of endurance times, and drive is performed with a window (white circle marks).

Figure 12:
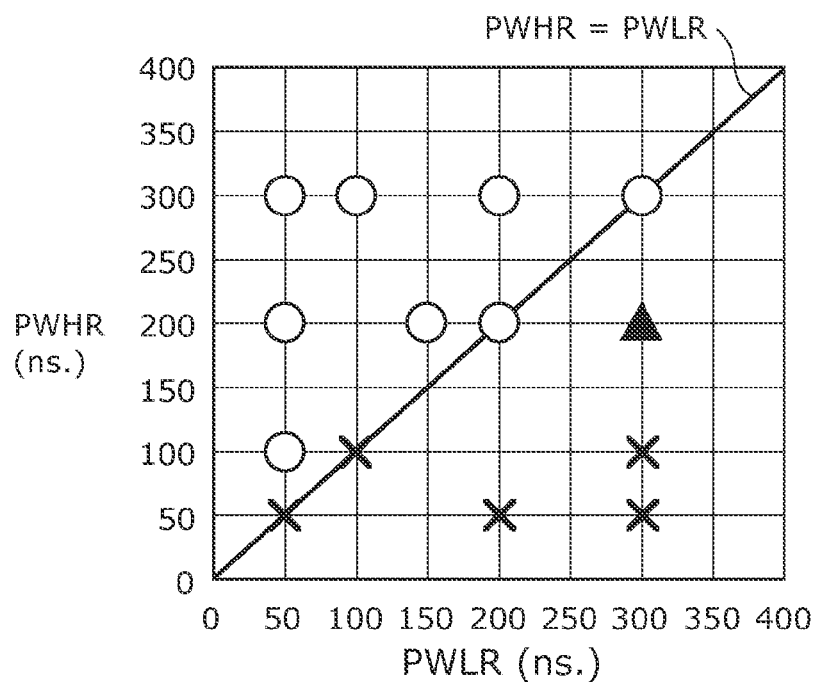
FIG. 12 is a graph showing whether endurance characteristics are good or bad for the variable resistance element when a voltage value VLR of writing voltage pulse is −2.4 V, and a voltage value VHR of erasing voltage pulse is +2.2 V.

FIG. 12 is a graph showing endurance characteristics of the variable resistance layer 3 satisfying (|VLR|>|VHR|) when the voltage value VLR of writing voltage pulse is −2.4 V, and the voltage value VHR of erasing voltage pulse is +2.2 V. As shown in FIG. 12, in the case of PWLR>PWHR, there is a mixed result of (i) the case where held HR error occurs at a time of less than the standard number of endurance times (x marks in FIG. 12) and (ii) the case where although held HR error does not occur until reaching the standard number of endurance times, the state of no window occurs (black triangle marks). In the case of PWHR=PWLR, there is a mixed result of (i) the case where no held HR errors occurs until reaching the standard number of endurance times and drive is performed with a window (white circle marks) and (ii) the case where held HR error occurs at a time of less than the standard number of endurance times (x marks). In the case of PWLR<PWHR, no held HR errors occurs until reaching the standard number of endurance times, and drive is performed with a window (white circle marks).

Figure 13:
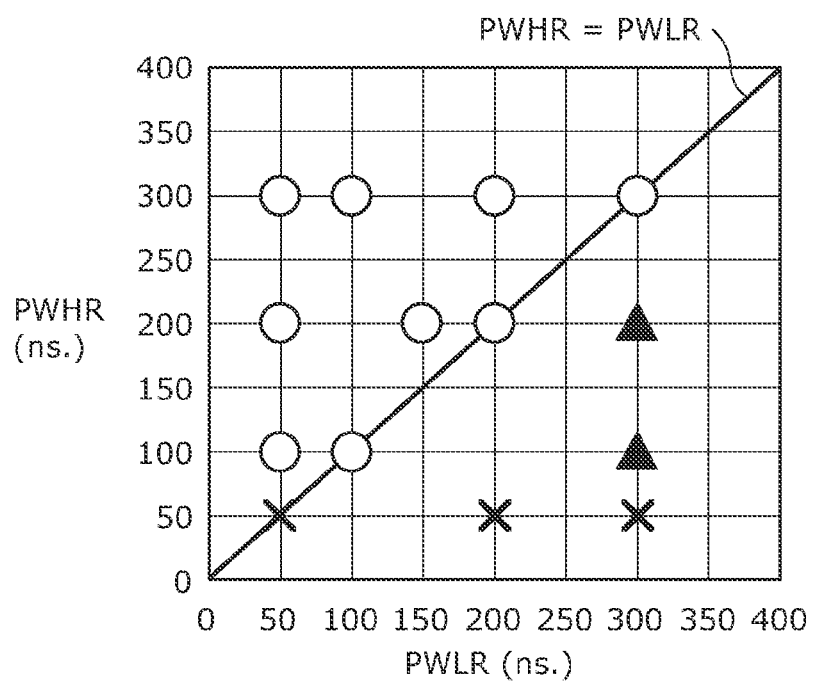
FIG. 13 is a graph showing whether endurance characteristics are good or bad for the variable resistance element when a voltage value VLR of writing voltage pulse is −2.4 V, and a voltage value VHR of erasing voltage pulse is +2.0 V.

FIG. 13 is a graph showing endurance characteristics of the variable resistance layer 3 satisfying (|VLR|>|VHR|) when the voltage value VLR of writing voltage pulse is −2.4 V, and the voltage value VHR of erasing voltage pulse is +2.0 V. As shown in FIG. 13, in the case of PWLR>PWHR, there is a mixed result of (i) the case where held HR error occurs at a time of less than the standard number of endurance times (x marks in FIG. 13) and (ii) the case where although held HR error does not occur until reaching the standard number of endurance times, the state of no window occurs (black triangle marks). In the case of PWHR=PWLR, there is a mixed result of (i) the case where no held HR errors occurs until reaching the standard number of endurance times and drive is performed with a window (white circle marks) and (ii) the case where held HR error occurs at a time of less than the standard number of endurance times (x marks). In the case of PWLR<PWHR, no held HR errors occurs until reaching the standard number of endurance times, and drive is performed with a window (white circle marks).

Figure 14:
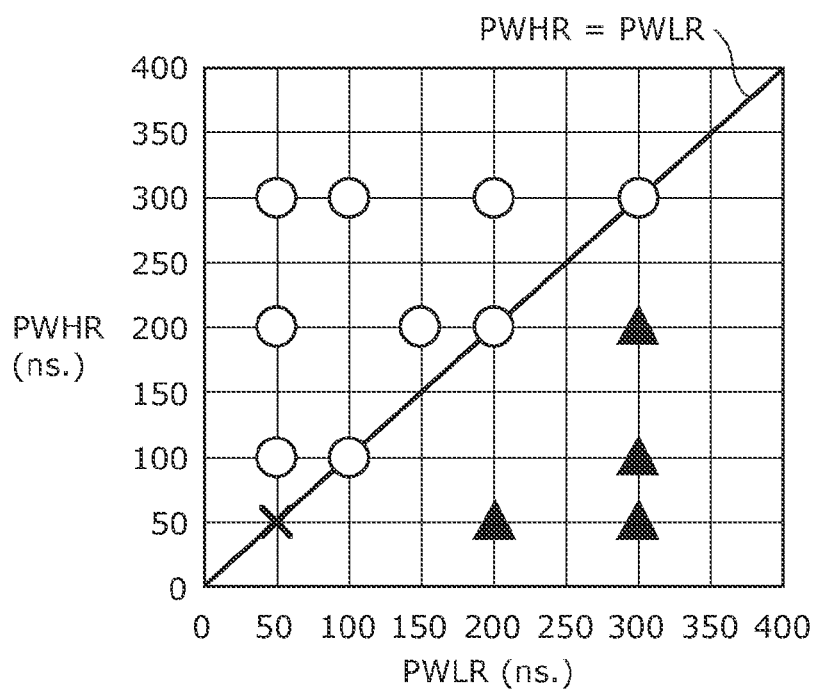
FIG. 14 is a graph showing whether endurance characteristics are good or bad for the variable resistance element when a voltage value VLR of writing voltage pulse is −2.4 V, and a voltage value VHR of erasing voltage pulse is +1.8 V.

FIG. 14 is a graph showing endurance characteristics of the variable resistance layer 3 satisfying (|VLR|>|VHR|) when the voltage value VLR of writing voltage pulse is −2.4 V, and the voltage value VHR of erasing voltage pulse is +1.8 V. As shown in FIG. 14, in the case of PWLR>PWHR, although the case where held HR error does not occur until reaching the standard number of endurance times, the state of no window occurs (black triangle marks in FIG. 14). In the case of PWHR=PWLR, there is a mixed result in which (i) the case where no held HR errors occurs until reaching the standard number of endurance times and drive is performed with a window (white circle marks) and (ii) the case where held HR error occurs at a time of less than the standard number of endurance times (x marks). In the case of PWLR<PWHR, no held HR errors occurs until reaching the standard number of endurance times, and drive is performed with a window (white circle marks).

In the results shown in FIGS. 11 to 14, in the case of PWLR<PWHR, no held HR errors occurs until reaching the standard number of endurance times, and drive is performed with a window (white circle marks). Therefore, when the pulse width PWLR of the writing voltage pulse and the pulse width PWHR of the erasing voltage pulse satisfy the condition of PWLR<PWHR, it is found that good endurance characteristics can be realized. Moreover, in the case of PWHR=PWLR, good or bad of endurance characteristics is different according to the values of PWLR and PWHR and the values of VLR and VHR. It is found that when the values of PWLR and PWHR are relatively great, good endurance characteristics can be obtained. Meanwhile, in the case of PWLR>PWHR, it is found that endurance characteristics are decreased and this is not favorable.

It should be noted that in the effect of PWLR<PWHR which is confirmed in the above described example, by applying sufficient effective voltage is applied to the variable resistance layer 3 for changing to the low resistance state, good endurance characteristics are realized. Therefore, by using not only the variable resistance material in the example but also other variable resistance materials, the same effect can be obtained.

Moreover, FIGS. 12 to 14 are results of the case where the voltage value VLR of writing voltage pulse and the voltage value VHR of erasing voltage pulse satisfy |VLR|>|VHR|. At this time, in the results shown in FIGS. 12 to 14, even in the case of PWLR>PWHR or PWLR=PWHR, it is found that no held HR error does not occur until reaching the standard number of endurance times (white circle marks or black triangle marks). Moreover, FIG. 11 are the result of the case where the voltage value VLR of writing voltage pulse and the voltage value VHR of erasing voltage pulse satisfy |VLR|=|VHR|. At this time, in the result shown in FIG. 11, in the case of PWLR>PWHR and PWLR=PWHR, held HR error occurs at a time of less than the standard number of endurance times (x marks). From the above described results, a technique philosophy that good endurance characteristics can be obtained in the case of PWLR<PWHR is more evident than the case of |VLR|=|VHR|, and is thought to have a strong relationship with the condition of |VLR|=|VHR|. In other words, |VLR|≥|VHR| in which |VLR|=|VHR| is a boundary is effective in increasing good endurance characteristics.

Here, as data for complementing the relationship between (i) the pulse widths of the writing voltage pulse applied to the nonvolatile memory element 30 for increasing endurance characteristics and between (ii) voltage values of the erasing voltage pulse to be applied to the nonvolatile memory element 30 for increasing endurance characteristics, endurance characteristics in which |VLR|>|VHR| is set in the case of PWLR=PWHR will be described.

FIGS. 15 to 19 show endurance characteristics results in the case of where the same voltage value VLR of the writing voltage pulse is erased with different voltage values VHR of the erasing voltage pulse.

It should be noted that in the examples according to FIGS. 15 to 19, the nonvolatile memory element 30 shown in (a) in FIG. 6 and (a) in FIG. 7 are used. In other words, the field-effect transistor 20 is the N-type MISFET 20.

In the present example, the gate voltage Vg of the N-type MISFET 20 is set to 2.4 V, the pulse width PWLR of the writing voltage pulse and the pulse width PWHR of the erasing voltage pulse is set to 100 ns for all the example. By setting the pulse width of the writing voltage pulse and the pulse width of the erasing voltage pulse to be mutually equal, the speed of the writing step can be equal to the speed of the erasing step. Therefore, one of the steps with a fast speed is not delayed due to the influence of the other step with a slow speed, and therefore the overall speed of the writing step and the erasing step can be faster. With this, for example, the control of multiple bit write is easier.

In FIGS. 15 to 19 to be described later, the vertical axis shows a current value of a read current flowing when the read voltage (0.4 V) is applied to the nonvolatile memory element 30, and the horizontal axis shows the number of repetition times when the writing step and the erasing steps are alternately repeated. It should be noted that in the number of repeating times, one cycle of the writing step and the erasing step is counted as one.

In FIGS. 15 to 19, each of the points in the graph, for convenience sake, shows a distribution of the read current values in a plurality of times for each one point. Specifically, when the number of repetition times is from 100 to 1000, the distribution of current values of the read current when the writing step and the erasing step are repeated 34 times is shown for each of the points. When the number of repetition times is from 1000 to 10000, the distribution of current values of the read current when the writing step and the erasing steps are repeated 490 times is shown for each of the points. Hereinafter, 1000 times and 10000 times as the standard number of repetitions times are called "the first standard number of endurance times" and "the second standard number of endurance times".

In FIGS. 15 to 19, a bar for each of the points denotes the distribution of current values of read current, and a circle for each of the points denotes a median of the current values. A black circle denotes a median of the current values of read current when the writing step is performed, and a white circle denotes a median of the current values of read current when the erasing step is performed.

Figure 15:
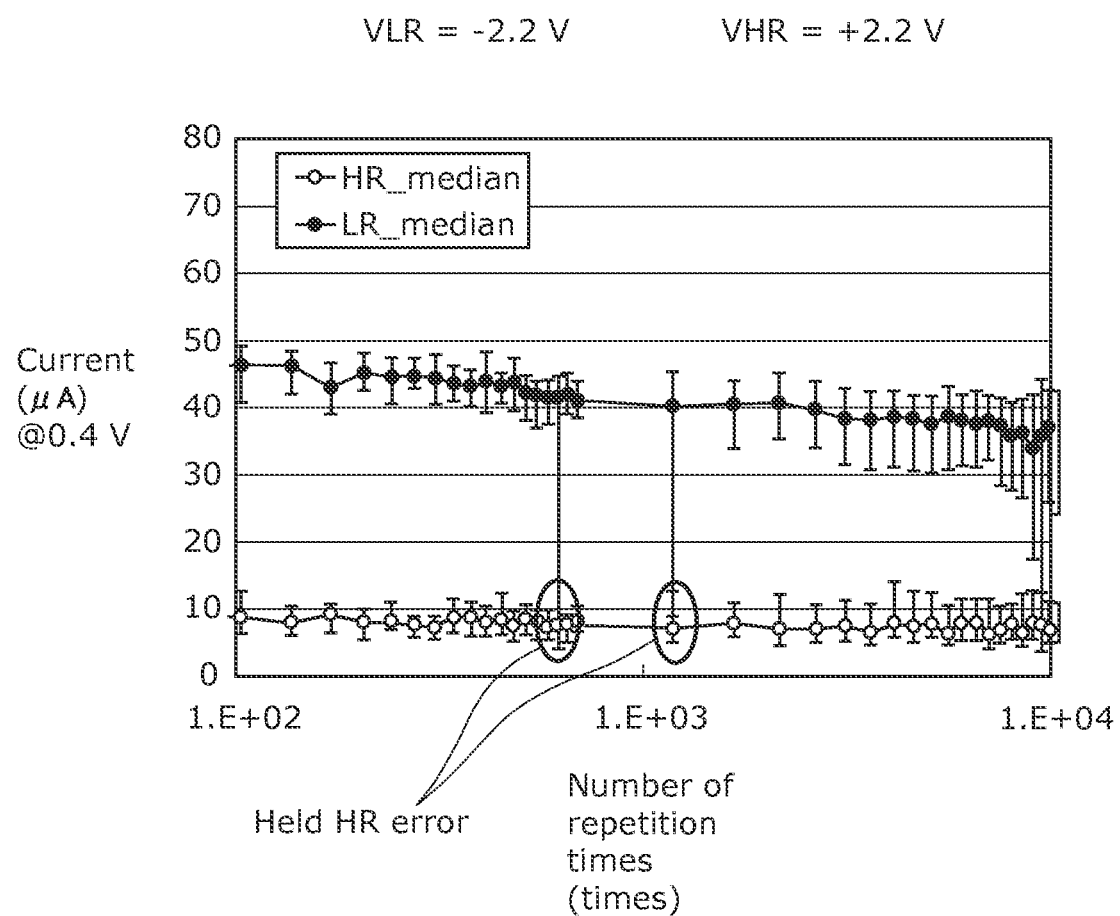
FIG. 15 is a graph showing endurance characteristics of the variable resistance element when a voltage value VLR of writing voltage pulse is −2.2 V, and a voltage value VHR of erasing voltage pulse is +2.2 V.

FIG. 15 is a graph showing endurance characteristics of the variable resistance layer 3 when VLR is set to −2.2 V and VHR is set to +2.2 V (|VLR|=|VHR|).

As shown in FIG. 15, before the number of repetition times reaches 10000 times that is the standard number of endurance times, a change from the high resistance state to the low resistance state does not take place even after the writing step is performed, and there is a phenomenon in which the high resistance state remains as it is (refer to the place where "held HR error" is noted in FIG. 15). This shows that as described above, in the case of |VLR|=|VHR|, the held HR error occurs, and endurance characteristics are degraded.

Figure 16:
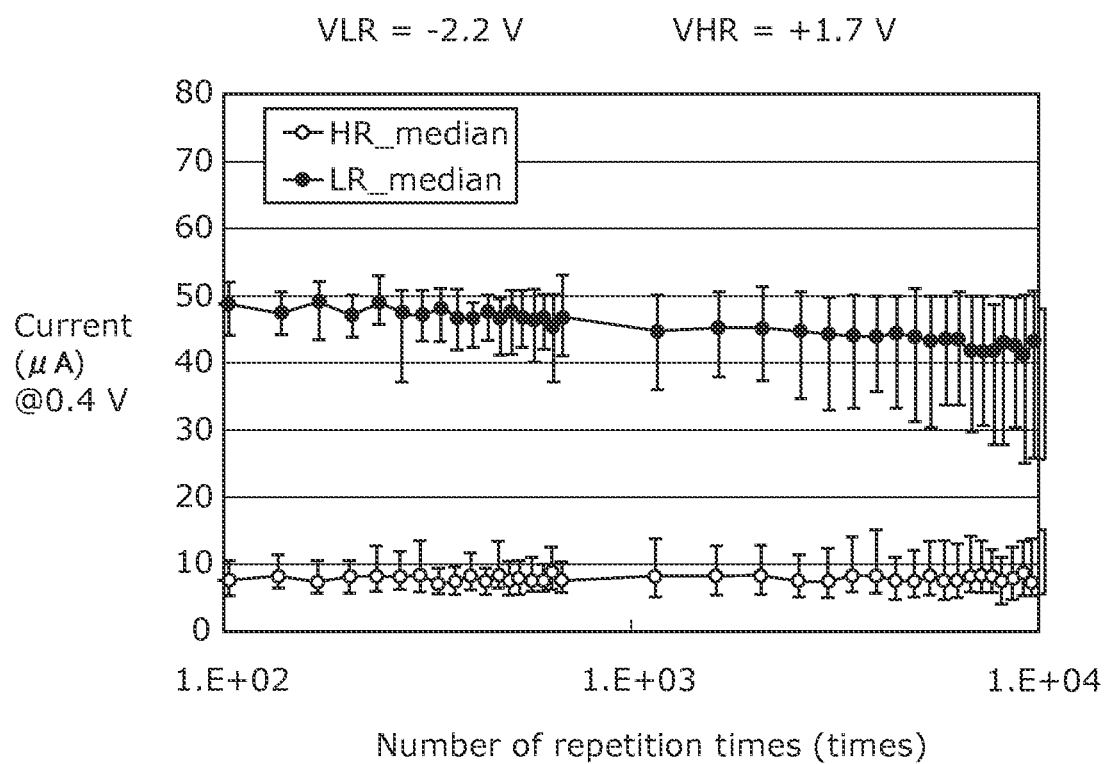
FIG. 16 is a graph showing endurance characteristics of the variable resistance element when a voltage value VLR of writing voltage pulse is −2.2 V, and a voltage value VHR of erasing voltage pulse is +1.7 V.

FIG. 16 is a graph showing endurance characteristics of the variable resistance layer 3 when VLR is set to −2.2 V and VHR is set to +1.7 V (|VLR|>|VHR|). As shown in FIG. 16, until the number of repetition times is 10000 that is the standard number of endurance times, held HR error does not occur.

Figure 17:
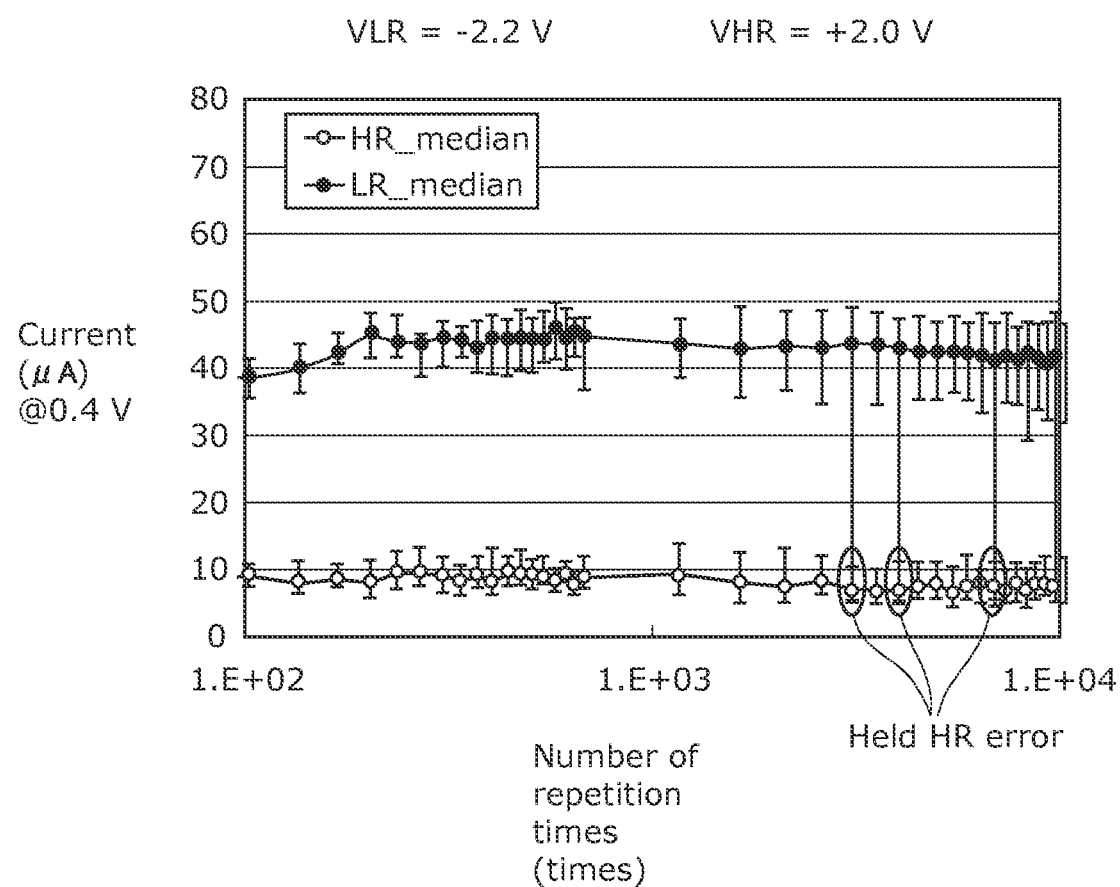
FIG. 17 is a graph showing endurance characteristics of the variable resistance element when a voltage value VLR of writing voltage pulse is −2.2 V, and a voltage value VHR of erasing voltage pulse is +2.0 V.

FIG. 17 is a graph showing endurance characteristics of the variable resistance layer 3 when VLR is set to −2.2 V and VHR is set to +2.0 V (|VLR|>|VHR|). As shown in FIG. 17, held HR error does not occur until the number of repetition times is 1000 that is the first standard number of endurance times. However, held HR error occurs from about 3000 times before reaching 10000 that is the second standard number of endurance times.

Figure 18:
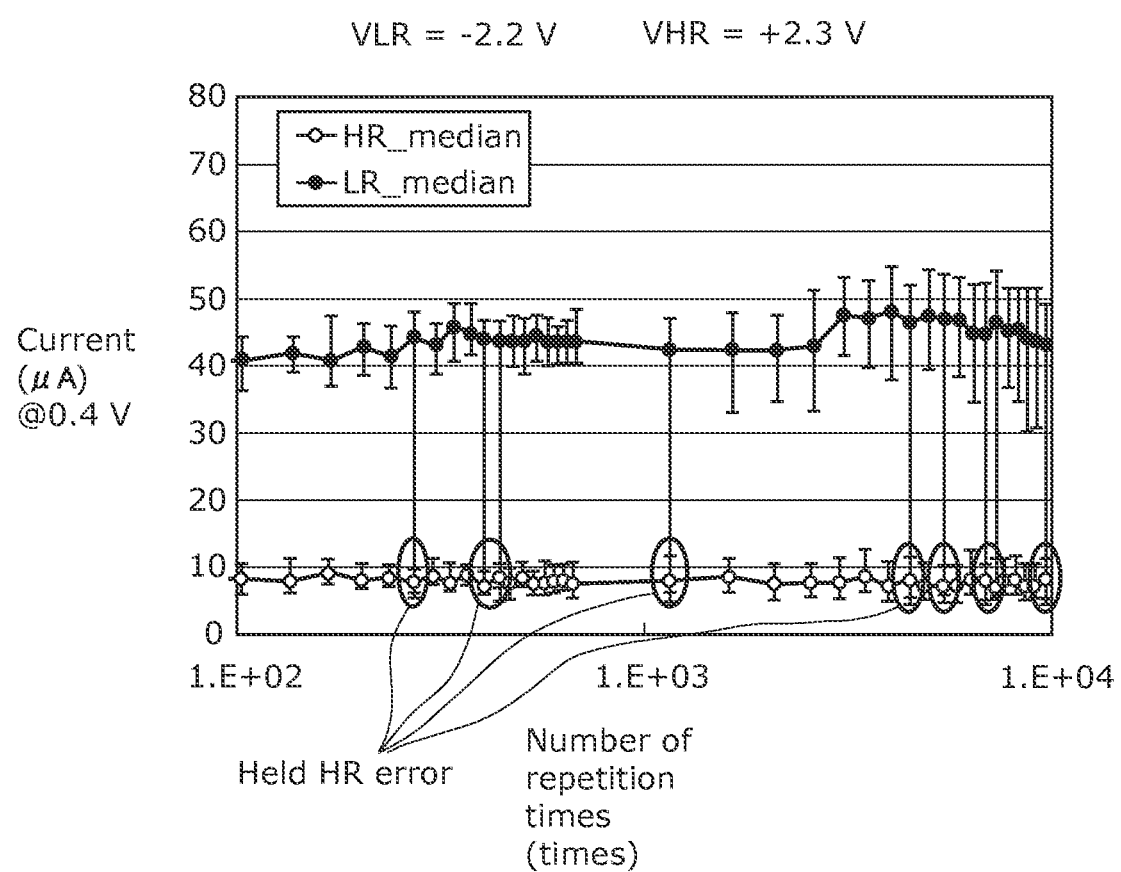
FIG. 18 is a graph showing endurance characteristics of the variable resistance element when a voltage value VLR of writing voltage pulse is −2.2 V, and a voltage value VHR of erasing voltage pulse is +2.3 V.

FIG. 18 is a graph showing endurance characteristics of the variable resistance layer 3 when VLR is set to −2.2 V and VHR is set to +2.3 V (|VLR|<|VHR|). As shown in FIG. 18, held HR error occurs from about 300 times before reaching 1000 that is the first standard number of endurance times.

Figure 19:
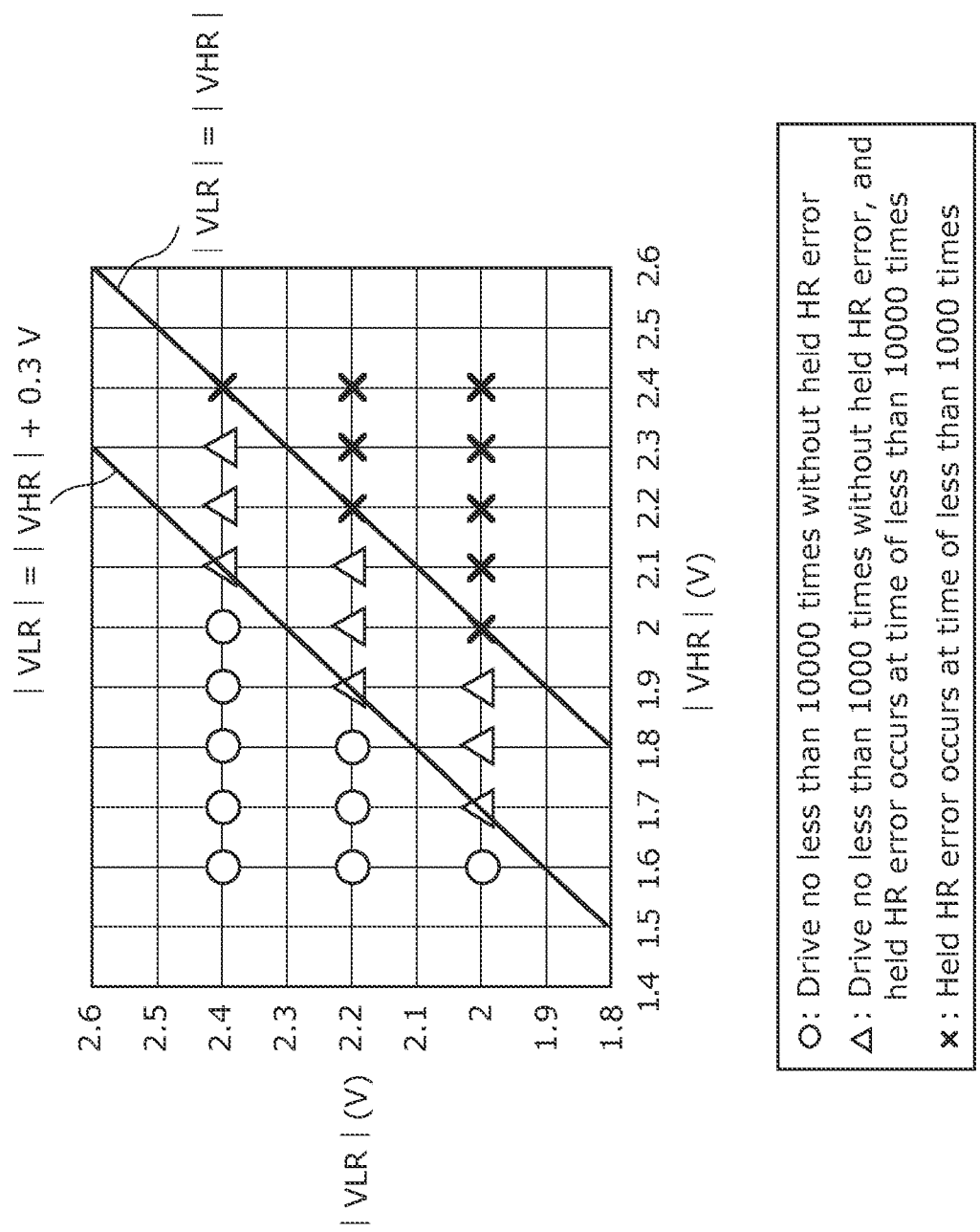
FIG. 19 is a graph showing whether the endurance characteristics are good or bad.

FIG. 19 is a graph in which endurance characteristics are assessed by changing the value of VLR at a 0.2 V step and the value of VHR at a 0.1 V step, and the obtained results are compiled by setting the vertical axis as an absolute value of the VLR and setting the horizontal axis as an absolute value of VHR. Here, the case where held HR error does not occur until reaching 10000 times that is the second standard number of endurance times is denoted by a white circle mark, the case where held HR error occurs from 1000 times that is the first standard number of endurance times to 10000 times that is the second standard number of endurance times is denoted by a white triangle mark, and the case where held HR error occurs at a time of less than 1000 times that is the first standard number of endurance times is denoted by an x mark. It should be noted that although the step of VLR is 0.2 V and the step of VHR is 0.1 V, a voltage value of another step may be used depending on the characteristics of the variable resistance element 10.

As shown in FIG. 19, in the case of |VLR|=|VHR| and |VLR|<|VHR|, held HR error occurs at a time of less than 1000 times. In the case of from |VLR|<|VHR| to |VLR|=|VHR|+0.3 V, held HR error does not occur at a time of less than 1000 times, and held HR error occurs at a time from 1000 times to 10000 times. In the case of |VLR|=|VHR|+0.3 V, held HR error does not occur until reaching 10000 times. In other words, the relationship between VLR and VHR in the present embodiment, |VLR|>|VHR| is desirable and |VLR|>|VHR|+0.3 V is more desirable.

In an effect of setting VLR and VHR as |VLR|>|VHR|, held HR error is reduced by increasing the current value limited by the body effect. Therefore, by using not only the variable resistance material in the example but also other variable resistance materials, it is estimated that the same effect can be obtained.

It should be noted that it is estimated that a degree of the more desirable effect by setting VLR and VHR as |VLR|>|VHR|+0.3 V is different according to a variable resistance material. Specifically, the above described value of 0.3 V is a value in the case where the variable resistance layer 3 comprises a tantalum oxide. It is possible that a different value is obtained in another variable resistance material.

The above described FIGS. 15 to 19 correspond to the drawings in which endurance characteristics of PWLR=PWHR on a straight line in FIGS. 8 to 14 are showed in detail. As described above, in FIGS. 15 to 19, it is found that in the case of PWLR=PWHR, |VLR|>|VHR|+0.3 V is more desirable.

Moreover, when endurance characteristics of PWLR=PWHR on the straight line in FIGS. 11 to 14 are compared, the number of the cases (white circle marks) where held HR error does not occur until reaching 10000 times that is the second standard number of endurance times is increased in |VLR|=|VHR| shown in FIG. 11, |VLR|>|VHR|+0.2 V shown in FIG. 12, and |VLR|>|VHR|+0.4 V shown in FIG. 13. Moreover, the number of white circle marks in |VLR|>|VHR|+0.6 V shown in FIG. 14 is unchanged from the case of |VLR|>|VHR|+0.4 V shown in FIG. 13. Therefore, also in FIGS. 11 to 14, in the case of PWLR=PWHR, it is more desirable that a voltage value to stabilize endurance characteristics is |VLR|>|VHR|+0.3 V. Moreover, in FIGS. 11 to 14, since overall endurance characteristics increase in the case of PWLR<PWHR rather than in the case of PWLR=PWHR, |VLR|>|VHR|+0.3 V is more desirable also in the case of PWLR<PWHR.

As described above, in the configuration of the nonvolatile memory element 30 which generates the body effect in the transistor 20 when a voltage pulse for changing the variable resistance layer 3 from the high resistance state to the low resistance state is applied to the transistor 20 and the variable resistance element 10, by driving the pulse width PWLR of the writing voltage pulse and the pulse width PWHR of the erasing voltage pulse to satisfy PWLR<PWHR, the nonvolatile memory element 30 having good endurance characteristics can be realized.

[Embodiment 2]

A nonvolatile memory device according to Embodiment 2 is a nonvolatile memory device which includes the nonvolatile memory element 30 described in Embodiment 1 and comprises 1-transistor/1-variable resistance element (1T1R). The following will described the configuration and operation of the nonvolatile memory device.

[Configuration of Nonvolatile Memory Device]

Figure 20:
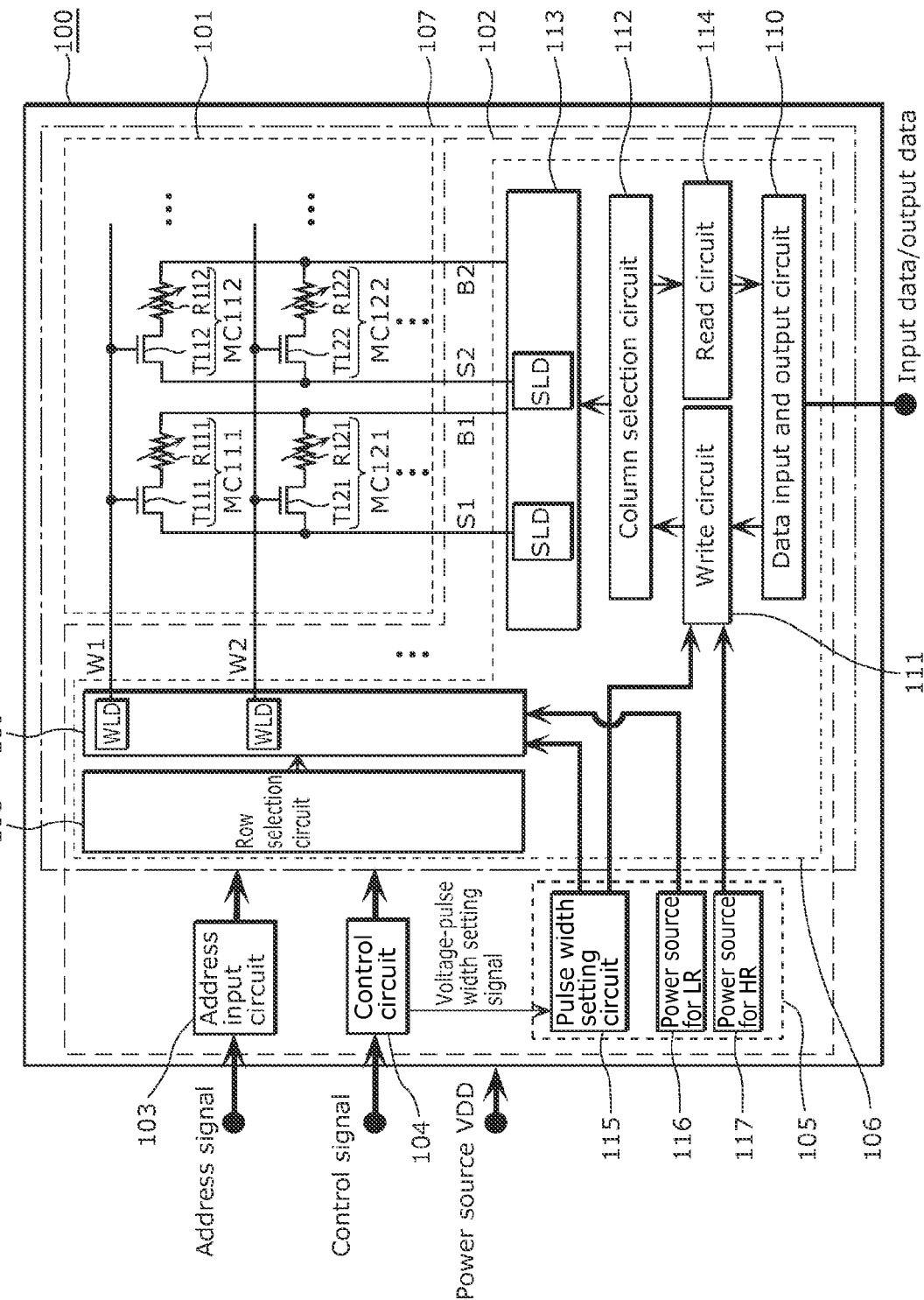
FIG. 20 is a block diagram showing an example of a configuration of a nonvolatile memory device according to Embodiment 2 of the present invention.

FIG. 20 is a block diagram showing an example of a configuration of a nonvolatile memory device 100 according to the present embodiment. As shown in a dashed line in FIG. 20, the nonvolatile memory device 100 includes a memory array 101 and a voltage application unit 102. In the memory array 101, the nonvolatile memory elements shown in Embodiment 1 are disposed, and each of the nonvolatile memory elements composes a memory cell. The voltage application unit 102 includes an address input circuit 103, a control circuit 104, a write power source unit 105, and a memory drive circuit 106.

From another point of view, in an alternate long and short dash line as shown in FIG. 20, when a region including includes the memory array 101 and the memory driving circuit 106 is defined as the memory main body 107, the nonvolatile memory device 100 includes the address input circuit 103, the control circuit 104, and the write power source unit 105.

The memory driving circuit 106, based on an address signal and a data signal that are input from an external circuit to the address input circuit 103 and the data input and output circuit 110, selects a predetermined memory cell of the memory array 101, and programs (or writes) predetermined data into the selected memory cell using a writing voltage and erasing voltage that are inputted from the write power source unit 105 and the like, or reads information of the memory cell from the data input and output circuit 110 by applying a read voltage to the selected memory, and then outputs the data to the outside. The memory driving circuit 106, for example, includes a row selection circuit 108, a row driver 109, a data input and output circuit 110, a write circuit 111, a column selection circuit 112, a column driver 113, and a read circuit 114. The write power source unit 105 sets a writing voltage pulse and an erasing voltage pulse. The write power source unit 105, for example, includes a pulse width setting circuit 115, a power source for LR 116, and a power source for HR 117. The following will describe an example of the case where the pulse width setting circuit 115 functions as another block separately from the power source for LR 116 and the power source for HR 117. However, the pulse width setting circuit 115 is not limited to such. For example, a configuration is acceptable in which a pulse width is set with respect to a power source voltage each outputted from the power source for LR 116 and the power source for HR 117.

The memory array 101, as shown in FIG. 20, two word lines W1 and W2 extending in a horizontal direction, two source lines S1 and S2 extending in a vertical direction by crossing the word lines W1 and W2, and four memory cells MC111, MC112, MC121, and MC122 provided in matrix corresponding to each of the cross points of the word lines W1 and W2 and the bit lines B1 and B2, respectively.

It should be noted that the number for each of the constituent elements are not limited to that in the above described configuration. For example, as described above, the four memory cells are illustrated in the memory array 101 in FIG. 20. However, this is an example. A configuration in which five or more memory cells are provided is acceptable. Here, for convenience sake, the following will describe the case where the number of memory cells is four.

The above described memory cells MC111, MC112, MC121, and MC122 each include the nonvolatile memory element 30. With reference to FIG. 3, the configuration of the memory array 101 will be described in detail. In the memory array 101, the memory cell MC111 is provided between the bit line B1 and the source line S1, and the memory cell MC111 is composed of a nonvolatile memory element in which a transistor T111, and a variable resistance element R111 are serially connected. More specifically, the transistor T111 is connected to the bit line B1 and the variable resistance element R111 between the bit line B1 and the variable resistance element R111, while the variable resistance element R111 is connected to the transistor T111 and the source line S1 between the transistor T111 and the source line S1. It should be noted that a gate terminal of the transistor T111 is connected to the word line W1.

It should be noted that the connection states of the transistors T112, T121, and T122 composing the other three memory cells MC112, MC121, and MC122, respectively, and the variable resistance elements R112, R121, and R122, respectively, are the same as those in the case of the transistor T111 and the variable resistance element R111 comprised in the memory cell MC111. Therefore, a description will be omitted thereof.

With the above described configuration, when a predetermined voltage is supplied to the gate each for the transistor T111, T112, T121, and T122 via the word lines W1 and W2, conduction is realized between the drain and the source of the transistors T111, T112, T121, and T122.

The address input circuit 103 receives an address signal from the external device (not illustrated), and a row address signal is outputted to the row selection circuit 108 based on the address signal, and a column address signal is outputted to the column selection circuit 112. Here, the address signal is a signal which shows the address of the memory cell selected from the memory cells MC111, MC112, MC121, and MC122. Moreover, the row address signal is a signal which shows the address of the row among the addresses indicated by the address signal. The column address signal is a signal which shows the address of the column.

The row selection circuit 108 receives the row address signal provided from the address input circuit 103, and determines the word line of the selected row (for example, the word line W1) based on the row address signal. Specifically, the row driver 109 is controlled such that a predetermined voltage (gate voltage) for turning on the transistor (transistors T111 and T112) is applied. Meanwhile, the row driver 109 is controlled such that a predetermined voltage for turning off the transistor comprised in the memory cell is applied or not applied to the word line of a non-selected row (for example, the word line W2). The row driver 109 includes a word line driver WLD connected to each of the word lines, and a voltage is applied to the word line by the word line driver WLD.

The column selection circuit 112 receives the column address signal provided from the address input circuit 103, and based on the column address signal, determines the source line (for example, the source line S1) and the bit line (for example, the bit line B1) of the column to be selected. Specifically, the column driver 113 is controlled such that the writing voltage, the erasing voltage, or the read voltage is applied to between the source line and the bit line, a predetermined voltage (for example, source voltage/drain voltage) is applied to the transistor connected to between the source line and the bit line (for example the transistors T111 and T121). Meanwhile, the column driver 113 is controlled such that a non-selected voltage is applied to the source line of the non-selected column (for example, the source line S2) and the non-selected bit line (for example, the bit line B2). The column driver 113 includes a source line driver SLD connected to each of the source lines, and a voltage is applied to the source line by the source line driver SLD.

As described above, the memory cell (for example, the memory cell MC111) connected to the location in which the selected row and the selected column cross is selected.

The read circuit 114 determines whether the selected memory cell is in the low resistance state or the high resistance state, outputs the determination as a logical result, and determines the state of the data stored in the memory cell. The obtained output data is outputted to the external device via the data input and output circuit 110. Moreover, it is possible to cause the read circuit 114 to determine a level of the high resistance state (high resistance value). In this case, it is determined whether or not the high resistance value of the nonvolatile memory device exceeds a predetermined threshold that causes held low resistance, and information of the determination result is provided to the control circuit 104.

The write circuit 111, via the data input and output circuit 110, applies the writing voltage corresponding to the input data inputted from the external device, to the source line and the bit line selected by the row selection circuit 112.

The control circuit 104, corresponding to the control signal received from the external device or the read circuit 114, selects one of the write mode (corresponding to the writing step and the erasing step) and the read mode. Specifically, the control circuit 104 controls the write power source unit 105 and the write circuit 111 such that data is written into the selected memory cell. Here, the control circuit 104 provides, to the write power source unit 105, a voltage-pulse width setting signal which instructs a voltage level of the voltage pulse at the time of write.

In the case of the write mode, the control circuit 104, corresponding to the input data, outputs the control signal which instructs a "writing voltage pulse application" to the write circuit 111 and the column driver 113.

In the case of the read mode, the control circuit 104 outputs, to the column driver 113, the control signal which instructs a "read voltage pulse application". In the read mode, the control circuit 104 further receives, from the column driver 113, a signal showing current values flowing in the source S1 and S2. The current values are each measured by a sense amplifier (not illustrated) and the like. The control circuit 104 converts the received signal into output data showing a bit value, and then outputs the output data to the external device. The output data corresponds to the value of the writing voltage pulse applied to the selected/non-selected source line.

[Operation of Nonvolatile Memory Device]

As described above, in the case of the nonvolatile memory device according to the present embodiment, in the write mode, "the writing step" and "the erasing step" described in Embodiment 1 are executed. Then, the pulse width PWLR of the writing voltage pulse to be applied to each of the memory cells in "the writing step" and the pulse width PWHR of the erasing voltage pulse to be applied to each of the memory cells in "the erasing step" are controlled to satisfy PWLR<PWHR. With this, the nonvolatile memory device 100 can realize good endurance characteristics.

[Another Configuration of Nonvolatile Memory Device]

Figure 21:
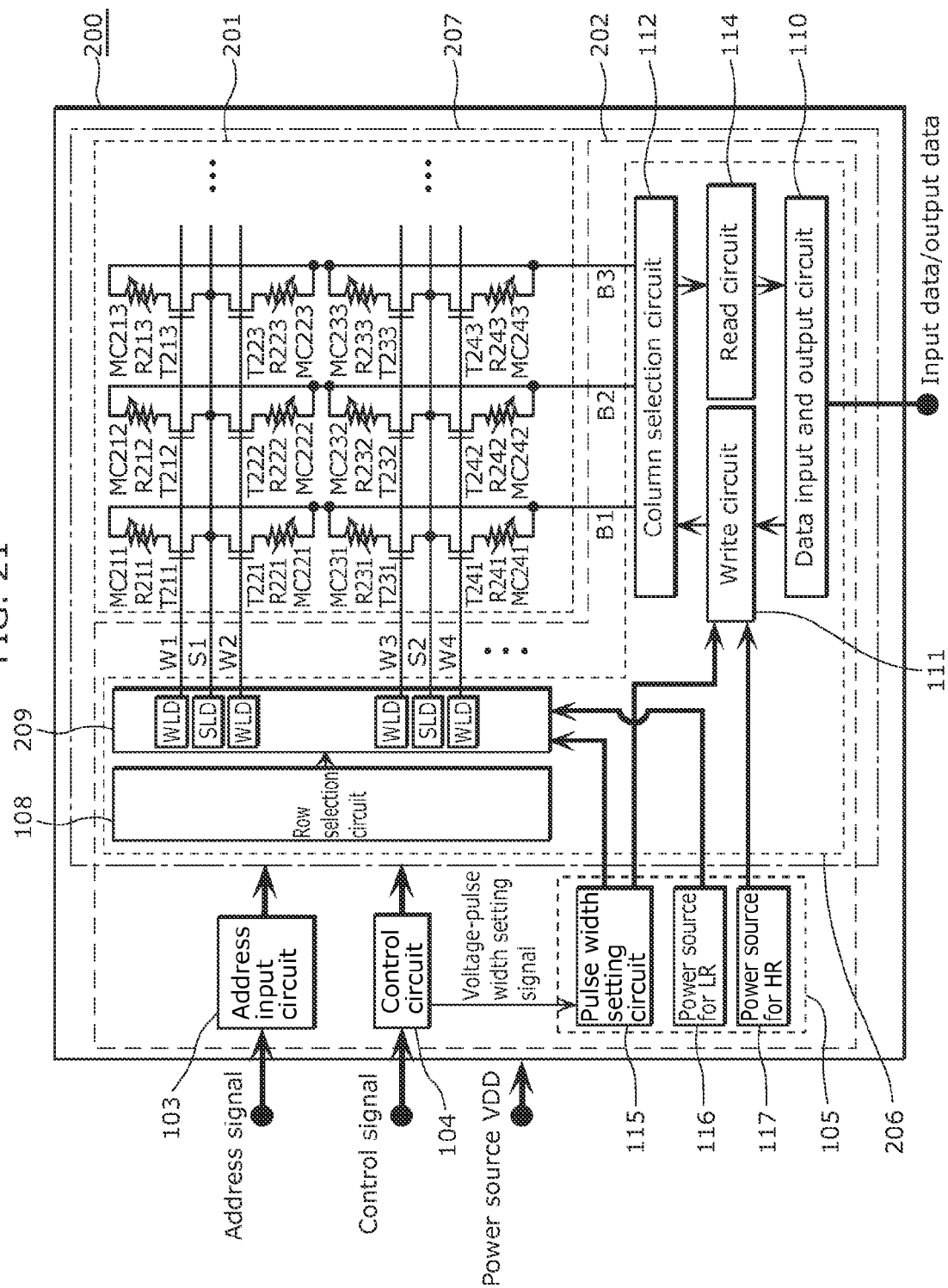
FIG. 21 is a block diagram showing an example of a configuration of the nonvolatile memory device according to Embodiment 2 of the present invention.
Figure 22:
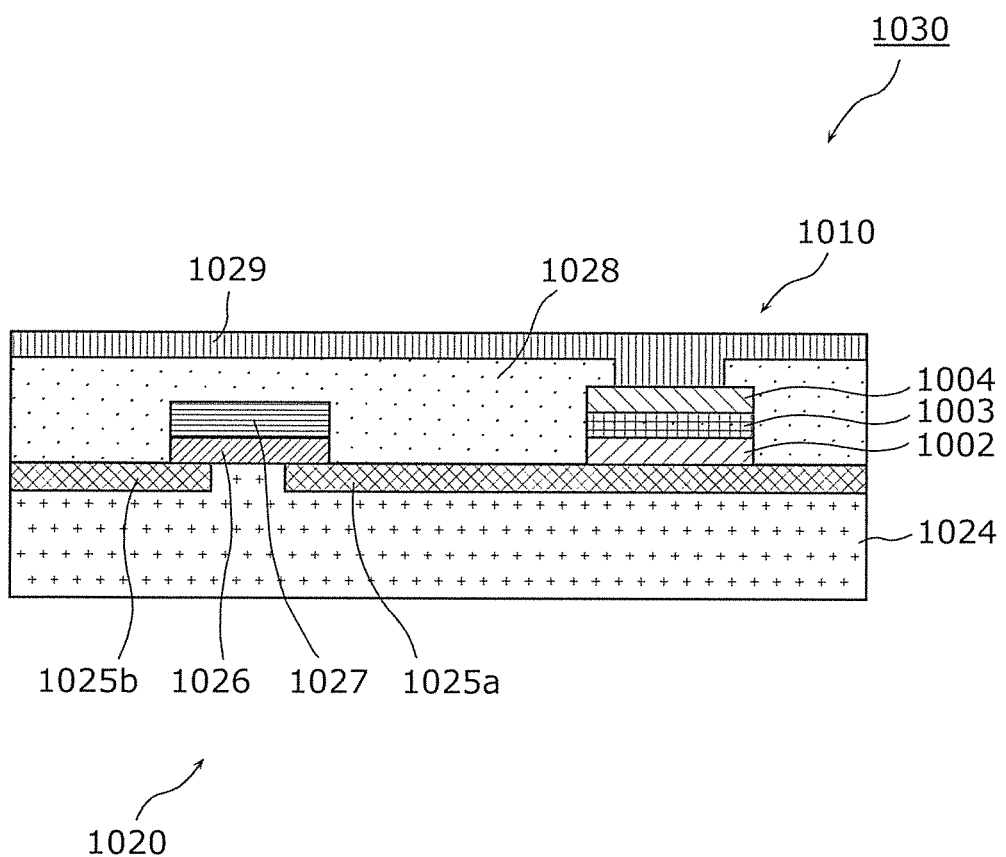
FIG. 22 is a cross-sectional view showing a configuration of a conventional nonvolatile memory element.

FIG. 21 is a block diagram showing a modification of a configuration of the nonvolatile memory device according to the present embodiment. The structure of the nonvolatile memory device 200 in FIG. 21 is partially different from those of the above described nonvolatile memory device 100 and the memory main body 207. Specifically, the configuration of the memory array 201 is different, and a voltage application unit 202 including a memory driving circuit 206 is different, too. It should be noted that a description about the portions that are the same as those in the configuration of the nonvolatile memory device 100 will be omitted by assigning the same reference numbers.

It should be noted that the memory array 201 in FIG. 20 illustrates 12 memory cells. However, this is an example. A configuration in which another number of memory cells are provided is acceptable. Here, for convenience sake, the following will describe the case where the number of memory cells is four.

In the memory array 201 of the nonvolatile memory device 200, the memory cells of the neighboring two rows are connected to a common source line extending in a horizontal direction. For example, the memory cell MC211 and the neighboring memory cell MC221 are connected to the common source line S1. Moreover, the source line driver SLD is disposed on the side of the row driver 209.

The row selection circuit 108 receives the row address signal provided from the address input circuit 103, and determines the word line of the selected row (for example, the word line W1) and the source line of the selected row (for example, the source line S1), based on the row address signal. Specifically, a predetermined voltage (gate voltage) for turning on the transistors (transistors T211, T212, and T213) is applied to the word line (for example, the word line W1), and the row driver 209 is controlled for applying the writing voltage, the erasing voltage, or the read voltage (for example, the source line S1). Meanwhile, the row driver 209 is controlled such that a predetermined voltage for turning off the transistor comprised in the memory cell is applied or not applied to the word lines of a non-selected row (for example, the word lines W2, W3, and W4). The row driver 209 is controlled such that a non-selected voltage is applied to the source lines of the non-selected column (for example, the source lines S1 and S2).

The column selection circuit 112 receives the column address signal provided from the address input circuit 103, and based on the column address signal, determines the bit line (for example, the bit line B1) of the selected column. Specifically, the writing voltage, the erasing voltage, or the read voltage is applied to the bit line of the selected column (for example, the bit line B1), and a non-selected voltage is applied to the non-selected bit lines (for example, the bit lines B2 and B3).

As described above, the memory cell (for example, the memory cell MC211) connected to the location in which the selected row and the selected column cross is selected.

The nonvolatile memory device 200, as similarly to the nonvolatile memory device 100, can control such that the pulse width PWLR of the writing voltage pulse and the pulse width PWHR of the erasing voltage pulse satisfy PWLR<PWHR. With this, also in the nonvolatile memory device 200, good endurance characteristics can be realized.

It should be noted that the configuration of the memory array and the circuit configuration according to Embodiment 2 are mere examples, and those are not defined only by the above described configurations. A publicly known circuit can be used for the circuit in each of the block diagrams. Moreover, a combination of the configurations according to the above described embodiments and the publicly known configurations makes it possible to realize a new embodiment.

As described above, the method for driving the nonvolatile memory element, and the nonvolatile memory device according to the present invention have been described. However, the present invention is not limited to the embodiments. Within a scope not departing from the spirit of the present invention, an embodiment to which various changes that occur to those skilled in the art are made, and an embodiment formed by combining components in different embodiments may also be included in the scope of the present invention.

The method for driving the nonvolatile memory element, and the nonvolatile memory device according to the present invention are each useful for the method for driving the nonvolatile memory element used in a variety of electronic devices such as a personal computer and a mobile phone terminal, as well as a memory device.

REFERENCE SIGNS LIST

1 Substrate
2, 1002 Bottom electrode
3, 1003 Variable resistance layer
3a First transition metal oxide layer (first tantalum oxide layer)
3b Second transition metal oxide layer (second tantalum oxide layer)
4, 1004 Top electrode
10 Variable resistance element
20, 1020 Field-effect transistor (transistor, MISFET)
24, 1024 Semiconductor substrate
30, 1030 Nonvolatile memory element
100, 200 Nonvolatile memory device
101, 201 Memory array
102, 202 Voltage application unit
103 Address input circuit
104 Control circuit
105 Write power source unit
106, 206 Memory driving circuit
107, 207 Memory main body
108 Row selection circuit
109, 209 Row driver
110 Data input and output circuit
111 Write circuit
112 Column selection circuit
113 Column driver
114 Read circuit
115 Pulse width setting circuit
116 Power source for LR
117 Power source for HR
1010 Nonvolatile memory unit
1029 Electrode wiring

The invention claimed is:

1. A method for driving a nonvolatile memory element which includes:
(i) a variable resistance element which includes a first terminal, a second terminal, and a variable resistance layer which is provided between the first terminal and the second terminal and has a resistance value that reversibly changes according to a voltage pulse applied to between the first terminal and the second terminal; and (ii) a field-effect transistor which includes a first input and output terminal connected to the second terminal, a second input and output terminal, and a gate terminal which controls conduction between the first input and output terminal and the second input and output terminal, the method comprising:

changing the variable resistance layer from a high resistance state to a low resistance state, by applying a writing voltage pulse having a first polarity to between the first terminal and the second input and output terminal; and changing the variable resistance layer from a low resistance state to a high resistance state, by applying an erasing voltage pulse having a second polarity different from the first polarity to between the first terminal and the second input and output terminal, wherein in the changing the variable resistance layer from a high resistance state to a low resistance state, the first input and output terminal is a source terminal, and when a pulse width of the writing voltage pulse is PWLR and a pulse width of the erasing voltage pulse is PWHR, PWLR and PWHR satisfy a relationship of PWLR<PWHR.

2. The method for driving a nonvolatile memory element according to claim 1,
wherein when a voltage value of the writing voltage pulse is VLR and a voltage value of the erasing voltage pulse is VHR, absolute values of VLR and VHR satisfy a relationship of |VLR|=|VHR|.

3. The method for driving a nonvolatile memory element according to claim 1,
wherein when a voltage value of the writing voltage pulse is VLR and a voltage value of the erasing voltage pulse is VHR, absolute values of VLR and VHR satisfy a relationship of |VLR|>|VHR|.

4. The method for driving a nonvolatile memory element according to claim 3,
wherein the variable resistance layer comprises a tantalum oxide, and
the absolute values of VLR and VHR further satisfy a relationship of |VLR|>|VHR|+0.3 V.

5. The method for driving a nonvolatile memory element according to claim 1,
wherein the field-effect transistor is an N-type MISFET, and
the first polarity is a polarity in which a potential of the second input and output terminal is higher than a potential of the first terminal.

6. The method for driving a nonvolatile memory element according to claim 1,
wherein the field-effect transistor is a P-type MISFET, and
the first polarity is a polarity in which a potential of the second input and output terminal is lower than a potential of the first terminal.

7. The method for driving a nonvolatile memory element according to claim 1,
wherein the variable resistance layer comprises a tantalum oxide.

8. The method for driving a nonvolatile memory element according to claim 7,
wherein the variable resistance layer includes:
a first region which includes an oxygen-deficient tantalum oxide having a composition represented by $TaO_x$; and
a second region which includes a second tantalum oxide having a composition represented by $TaO_y$ ($x<y$).

9. A nonvolatile memory device comprising:
a nonvolatile memory element which includes: (i) a variable resistance element which includes a first terminal, a second terminal, a variable resistance layer which is provided between the first terminal and the second terminal and has a resistance value that reversibly changes according to a voltage pulse applied to between the first terminal and the second terminal; and (ii) a field-effect transistor which includes a first input and output terminal connected to the second terminal, a second input and output terminal, and a gate terminal which controls conduction between the first input and output terminal and the second input and output terminal; and
control circuitry that changes the variable resistance layer from a high resistance state to a low resistance state, by applying a writing voltage pulse having a first polarity to between the first terminal and the second input and output terminal; and changes the variable resistance layer from a low resistance state to a high resistance state, by applying an erasing voltage pulse having a second polarity different from the first polarity to between the first terminal and the second input and output terminal,
wherein in the changing the variable resistance layer from a high resistance state to a low resistance state, the first input and output terminal is a source terminal, and
when a pulse width of the writing voltage pulse is PWLR and a pulse width of the erasing voltage pulse is PWHR, the voltage application unit is configured to apply the writing voltage and the erasing voltage to the nonvolatile memory element, to allow PWLR and PWHR to satisfy a relationship of PWLR<PWHR.

10. The nonvolatile memory device according to claim 9, wherein when a voltage value of the writing voltage pulse is VLR and a voltage value of the erasing voltage pulse is VHR, the voltage application unit is configured to apply the writing voltage and the erasing voltage to the nonvolatile memory element, to allow absolute values of VLR and VHR to satisfy a relationship of |VLR|=|VHR|.

11. The nonvolatile memory device according to claim 9, wherein when a voltage value of the writing voltage pulse is VLR and a voltage value of the erasing voltage pulse is VHR, the voltage application unit is configured to apply the writing voltage and the erasing voltage to the nonvolatile memory element, to allow absolute values of VLR and VHR to satisfy a relationship of |VLR|>|VHR|.

12. The nonvolatile memory device according to claim 11, wherein the variable resistance layer comprises a tantalum oxide, and
the voltage application unit is configured to apply the writing voltage and the erasing voltage to the nonvolatile memory element, to allow the absolute values of VLR and VHR to satisfy a relationship of |VLR|>|VHR|+0.3 V.

13. The nonvolatile memory device according to claim 9, wherein the field-effect transistor is an N-type MISFET, and
the voltage application unit is configured to apply, in the changing the variable resistance layer from a high resistance state to a low resistance state, a voltage having a polarity in which a potential of the second input and output terminal is higher than a potential of the first terminal.

14. The nonvolatile memory device according to claim 9, wherein the field-effect transistor is a P-type MISFET, and
the voltage application unit is configured to apply, in the changing the variable resistance layer from a low resistance state to a high resistance state, a voltage having a polarity in which a potential of the second input and output terminal is lower than a potential of the first terminal.

15. The nonvolatile memory device according to claim 9, wherein the variable resistance layer comprises a transition metal oxide.

16. The nonvolatile memory device according to claim 15, wherein the transition metal oxide is selected from the group consisting of a tantalum oxide, a zirconium oxide, and a hafnium oxide.

17. The nonvolatile memory device according to claim 15, wherein the transition metal oxide includes:
a first region which includes an oxygen-deficient transition metal oxide having a composition represented by $MO_x$; and
a second region which includes a transition metal oxide having a composition represented by $MO_y (x<y)$.

18. The nonvolatile memory device according to claim 17, wherein in the first and second regions, a transition metal element M of the transition metal oxide is selected from the group consisting of tantalum, zirconium, and hafnium.

19. The nonvolatile memory device according to claim 15, wherein the transition metal oxide includes a first region which includes an oxygen-deficient transition metal oxide having a composition represented by $MO_x$ when a first transition metal is represented by M, and a second region which includes a transition metal oxide having a composition represented by $NO_y$ when a second transition metal oxide different from the first transition metal oxide is represented by N, and
the $NO_y$ is lower than the $MO_x$ in degree of oxygen deficiency.

20. The nonvolatile memory device according to claim 19, wherein the second transition metal N is lower than the first transition metal M in standard electrode potential.

21. The method for driving a nonvolatile memory element according to claim 1,
wherein a resistance value of the variable resistance element is switched between two values in the writing step and the erasing step.

* * * * *